(12) United States Patent
Kawashita

(10) Patent No.: US 11,398,166 B2
(45) Date of Patent: Jul. 26, 2022

(54) DISPLAY AND METHOD OF PRODUCING DISPLAY

(71) Applicant: TOPPAN PRINTING CO., LTD., Tokyo (JP)

(72) Inventor: Masashi Kawashita, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 250 days.

(21) Appl. No.: 16/508,045

(22) Filed: Jul. 10, 2019

(65) Prior Publication Data
US 2019/0333418 A1 Oct. 31, 2019

Related U.S. Application Data

(63) Continuation of application No. PCT/JP2018/000547, filed on Jan. 11, 2018.

(30) Foreign Application Priority Data

Jan. 11, 2017 (JP) .............................. JP2017-002948

(51) Int. Cl.
*G09F 3/02* (2006.01)
*B42D 25/29* (2014.01)
(Continued)

(52) U.S. Cl.
CPC .............. *G09F 3/02* (2013.01); *B42D 25/29* (2014.10); *B42D 25/328* (2014.10);
(Continued)

(58) Field of Classification Search
CPC ... G09F 3/02; G09F 2003/0257; B42D 25/29; B42D 25/328; B42D 25/46; B42D 25/30;
(Continued)

(56) References Cited

U.S. PATENT DOCUMENTS

2006/0262250 A1 11/2006 Hobbs
2012/0235399 A1* 9/2012 Lochbihler .............. G02B 5/22
283/94
(Continued)

FOREIGN PATENT DOCUMENTS

DE 10 2012 105 571 A1 1/2014
JP 2000-177281 A 6/2000
(Continued)

OTHER PUBLICATIONS

Extended European Search Report dated Dec. 17, 2019 for corresponding Application No. 18738752.7.
(Continued)

*Primary Examiner* — Justin V Lewis
(74) *Attorney, Agent, or Firm* — Foley & Lardner LLP

(57) ABSTRACT

A display element including a layer with a protrusion-recess structure and a multilayer film layer disposed on the protrusion-recess structure and with a surface shape following the protrusion-recess structure. A pattern formed by the protrusion includes a plurality of shape elements when the protrusion-recess structure is viewed in a direction perpendicular to the surface. Each shape element has a length extending in one extending direction, larger than a length in a width direction perpendicular to the extending direction. The length in the width direction is equal to or less than a sub-wavelength. A standard deviation of the length in the extending direction is larger than a standard deviation of the length in the width direction. The display elements include (Continued)

a first display element and a second display element. The extending directions of the first display element and the second display element are different from each other.

13 Claims, 10 Drawing Sheets

(51) Int. Cl.
*B42D 25/328* (2014.01)
*G02B 5/18* (2006.01)
*G03F 7/20* (2006.01)
*B42D 25/30* (2014.01)
*B42D 25/45* (2014.01)
*G02B 5/28* (2006.01)

(52) U.S. Cl.
CPC ........... *G02B 5/1842* (2013.01); *G03F 7/202* (2013.01); *G09F 2003/0257* (2013.01)

(58) Field of Classification Search
CPC ........ B42D 25/45; G02B 5/1842; G02B 5/18; G02B 5/28; G03F 7/202; G03F 7/20; B29C 55/00; B29C 59/02; B32B 3/30; B32B 7/02
USPC .......................... 283/67, 70, 72, 94, 98, 901
See application file for complete search history.

(56) References Cited

U.S. PATENT DOCUMENTS

| 2015/0192897 A1 | 7/2015 | Schilling et al. |
| 2019/0333418 A1 | 10/2019 | Kawashita |

FOREIGN PATENT DOCUMENTS

| JP | 2000-211256 A | 8/2000 |
| JP | 2005-153192 A | 6/2005 |
| JP | 2007-225935 A | 9/2007 |
| JP | 2007-286113 A | 11/2007 |
| JP | 2012-078447 A | 4/2012 |
| JP | 6878895 B2 | 6/2021 |

OTHER PUBLICATIONS

International Searching Authority, "International Search Report," issued in connection with International Patent Application No. PCT/JP2018/000547, dated Apr. 3, 2018.

International Searching Authority, "Written Opinion," issued in connection with International Patent Application No. PCT/JP2018/000547, dated Apr. 3, 2018.

* cited by examiner

FIG.10A
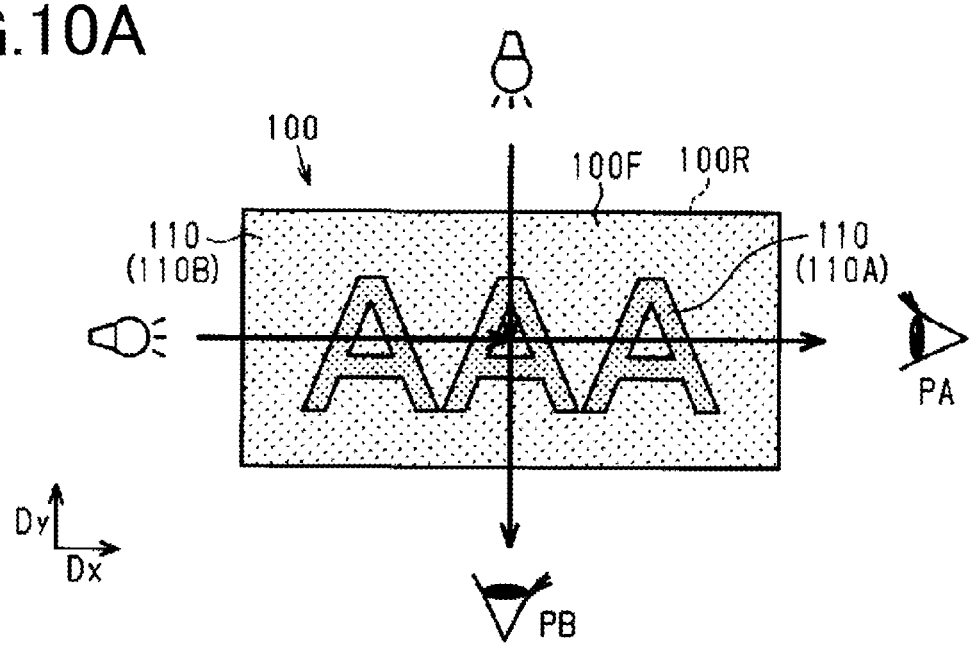
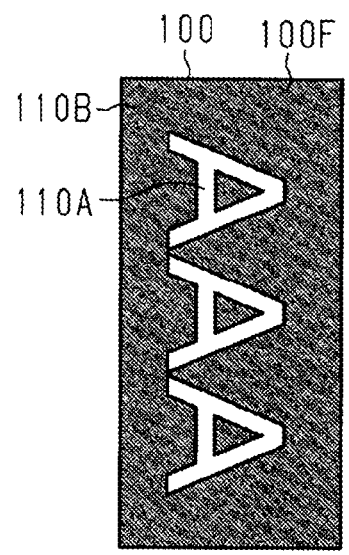
FIG. 10B
FIG.10C
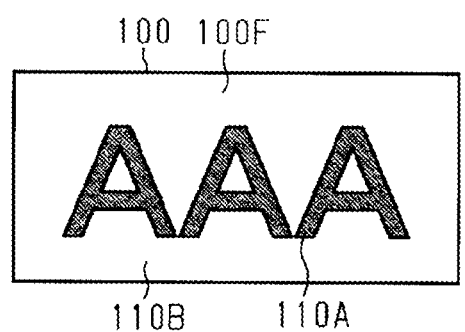

DISPLAY AND METHOD OF PRODUCING DISPLAY

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2018/000547, filed on Jan. 11, 2018, which is based upon and claims the benefit of priority to and Japanese Patent Application No. 2017-002948, filed on Jan. 11, 2017; the disclosures of which are all incorporated herein by reference in their entireties.

TECHNICAL FIELD

The present invention relates to a display using structural color and a method of producing the display.

Background Art

Structural colors, often observed as colors in the natural world, such as morpho butterfly wings, are different from colors of pigments that are visually recognized by electronic transition in molecules, and are visually recognized by effects of optical phenomena such as diffraction, interference, and scattering of light caused by fine structure of an object.

For example, the structural color produced by multilayer film interference is generated by interference of light reflected at each interface in the multilayer film in a multilayer film layer having refractive indices different between the adjacent thin layers. Multilayer interference is one of the color development principles of morpho butterfly wings. In morpho butterfly wings, in addition to multilayer film interference, scattering and diffraction of light occur due to a fine uneven structure on the surface of the wings. Thus, a bright blue color is visually recognized across a wide observation angle.

In order to provide a structure that artificially reproduces structural color like the morpho butterfly wings, PTL 1 proposes a structure in which a multilayer film layer is laminated on the surface of a substrate having fine irregular asperities.

In the multilayer film layer, the wavelength of light intensified by interference is determined by the optical path difference generated in the respective layers of the multilayer film layer, and the optical path difference is determined by the film thickness and refractive index of the respective layers. The emission direction of light which has been intensified by interference is limited to a direction at which an incident angle, which is an angle formed between the incident direction of incident light and the lamination direction of the multilayer film layer, becomes equal to a reflection angle, which is an angle formed between the emission direction and the lamination direction. Therefore, in the structure in which the multilayer film layer is laminated on a flat surface, the wavelength of the visually recognized reflected light changes greatly depending on the observation angle. Accordingly, the color visually recognized greatly changes depending on the observation angle.

On the other hand, in the structure of PTL 1, the multilayer film layer is laminated on irregular asperities, and the reflected light intensified by the interference spreads over a wide range. Accordingly, the change in color with observation angle is gradual. As a result, a structure that exhibits a specific color in a wide angular range like the morpho butterfly wings is achieved.

CITATION LIST

[Patent Literature] PTL 1: JP 2005-153192 A

SUMMARY OF THE INVENTION

Technical Problem

According to the structure that exhibits a structural color as described above, it is possible to obtain a visual effect that is difficult to achieve using colors exhibited by pigments. For example, in the structure described in PTL 1, a plurality of protrusions constituting the irregular asperities have a rectangular shape extending in a direction common to the respective protrusions when viewed in the direction perpendicular to the uneven surface, and the length in the short side direction is substantially constant, while the length in the long side direction is irregular. That is, the plurality of protrusions have anisotropy in the long side direction, and thus in the direction in which the reflected light spreads. Accordingly, the brightness or the like of the color exhibited by the structure changes depending on the position from which the structure is observed. Therefore, there is a demand to provide displays having high designability, for example, displays that can form an image with clear difference in contrast between regions by using such a change in appearance of the displays.

An object of the present invention is to provide a display with an improved designability, and a method for producing the display.

Solution to Problem

In order to solve the above problem, a display includes a plurality of display elements, the display having a front surface and a rear surface, and the display element including a protrusion-recess layer having a surface provided with a protrusion-recess structure and a multilayer film layer disposed on the protrusion-recess structure and having a surface shape which follows the protrusion-recess structure, wherein the multilayer film layer is configured such that adjacent layers in a plurality of layers included in the multilayer film layer have refractive indices that are different from each other, and light of a specific wavelength range in incident light that is incident on the multilayer film layer has reflectivity higher than the reflectivity of light of other wavelength ranges, the protrusion-recess layer and the multilayer film layer are laminated in a direction perpendicular to the front surface of the display, a protrusion included in the protrusion-recess structure has a shape having at least one step on a surface of the protrusion-recess layer, a pattern formed by the protrusion includes a pattern composed of a group of a plurality of shape elements extending in one extending direction when the protrusion-recess structure is viewed in a direction perpendicular to the surface of the protrusion-recess layer, each of the shape elements has a length in the extending direction, which is larger than a length in a width direction perpendicular to the extending direction, the length in the width direction being equal to or less than a sub-wavelength, the plurality of shape elements has a standard deviation of the length in the extending direction which is larger than a standard deviation of the length in the width direction, and the plurality of display elements include a first display element and a second display element, and the extending direction of the first display element and the extending direction of the second display element are different from each other.

With this configuration, in the display element, the reflected light of a specific wavelength range reflected by the multilayer film layer is scattered due to the protrusion-recess structure of the display element, and the scattering has anisotropy in the width direction. Since the width direction in the first display element and the width direction in the second display element are different from each other, a position at which the reflected light from the first display element is visually recognized and a position at which the reflected light from the second display element is visually recognized, among positions at which an observer observes the display, are different from each other. As a result, as the observation position for a display changes, a region in which the reflected light is visually recognized on the surface changes. Accordingly, for example, by using such a configuration, the observer can visually recognize different images depending on the observer's position. Thus, the designability of the display is improved.

In the above display, the extending direction of the first display element and the extending direction of the second display element may be orthogonal to each other. With this configuration, the direction in which the reflected light from the first display element is scattered and the direction in which the reflected light from the second display element is scattered are orthogonal to each other in a projected image in a plane of the front surface of the display. Accordingly, when the observer visually recognizes different images depending on the observer's positions, the difference in image depending on the observer's position can be readily recognized.

In the above display, in each of the plurality of display elements, a length in the width direction of the shape element may be 830 nm or less, and a height of the protrusion forming a pattern composed of a group of the plurality of shape elements may be 415 nm or less. With this configuration, since the spectrum and interference attributed to the protrusion-recess structure can be reduced, the visibility of the light reflected by the multilayer film layer can be increased.

In the above display, in each of the plurality of display elements, an average length of the plurality of shape elements in the extending direction may be 4.15 µm or less, and a standard deviation of the length may be 1 µm or less. With this configuration, light reflected by the multilayer film layer can be efficiently scattered.

In the above display, in each of the plurality of display elements, a ratio of an area occupied by the protrusion forming a pattern composed of a group of the plurality of shape elements to an area constituting the display element may be in a range of 40% or more and 60% or less when the protrusion-recess structure is viewed in a direction perpendicular to the surface of the protrusion-recess layer. With this configuration, light reflected by the multilayer film layer can be largely spread.

In the above display, a material and a film thickness of respective layers included in the multilayer film layer in the first display element and the second display element may be the same. With this configuration, the multilayer film layer can be simultaneously formed by the same steps in a region corresponding to the first display element and in a region corresponding to the second display element. Accordingly, the display can be formed by a simple production step.

In the above display, a height of the protrusion forming a pattern composed of a group of the plurality of shape elements in the first display element and a height of the protrusion forming a pattern composed of a group of the plurality of shape elements in the second display element may be different from each other with a difference therebetween of 5 nm or more.

With this configuration, different color hues are visually recognized in a region in which the first display element is located and a region in which the second display element is located. Thus, the designability of the display is improved. Since such a difference in color hue is achieved by the difference in height of the protrusions, and the multilayer film layers in the first display element and the second display element have the same configuration, there is no need to form a different multilayer film layer for each region in which each display element is located. Accordingly, displays having display elements that exhibit color hues different from each other can be formed by a simple production step.

In the above display, the display can include a first display region which includes the first display element, a second display region which includes the second display element, and a boundary region which is a region between the first display region and the second display region when viewed in a direction perpendicular to the front surface of the display, the protrusion-recess layer can be continuous with the first display region, the boundary region, and the second display region, the multilayer film layer can be continuous with the first display region, the boundary region, and the second display region, a minimum width of the boundary region in a direction in which the first display region and the second display region are arranged can be one-half or more of a thickness of the multilayer film layer, and a surface of the protrusion-recess layer in the boundary region can be a flat surface.

With this configuration, since the boundary region is located between the first display region and the second display region, the protrusion of the multilayer film layer in the first display element and the protrusion of the multilayer film layer in the second display element are prevented from being continuous with each other at the boundary between the first display region and the second display region. Further, the shape of the protrusion-recess structure which is originally intended for the surface of the multilayer film layer in the respective display elements is prevented from being modified due to continuation of the protrusions described above. As a result, the desired color development can be readily obtained from the entire display element in desired directions.

In the above display, a maximum width of the boundary region in a direction in which the first display region and the second display region are arranged may be 50 m or less. With this configuration, the boundary region is prevented from being visually recognized, and thus the light reflected by the boundary region is prevented from being visually recognized by the observer. Accordingly, the first display region and the second display region appear to the observer as if they are in contact with each other. Since desired color development can be readily obtained from the entire display element in desired directions in each of the first display region and the second display region, it is possible to form a precise image using the first display region and the second display region.

In the above display, a minimum width of the boundary region in a direction in which the first display region and the second display region are arranged may be larger than 50 µm. With this configuration, since the boundary region is visually recognizable, light reflected by the boundary region, that is, reflected light emitted in the specular reflection direction without having anisotropy is visually recognized by the observer according to the observation angle. Accordingly, it is possible to form an image that changes greatly depending on the difference in the observer's position by combination of the first display region and the second display region that cause reflected light of a specific wavelength range to be observed in a wide angular range at a specific position for each of the display regions in a plane on the front surface of the display, and the boundary region that causes reflected light of a specific wavelength range corresponding to the observation angle is observed at any position in a plane on the front surface of the display. Therefore, it is possible to represent images with more variety, and thus further improve the designability of the display.

In the above display, in each of the plurality of display elements, a pattern formed by the protrusions included in the protrusion-recess structure may include only a pattern composed of a group of the plurality of shape elements when the protrusion-recess structure is viewed in a direction perpendicular to the surface of the protrusion-recess layer, and a height of the protrusion included in the protrusion-recess structure may be constant within the display element.

With this configuration, a diffusion effect of the reflected light is obtained by the protrusion, and in each of the display elements, light of a specific wavelength range is observed across a wide angular range as light reflected by the multilayer film layer. Accordingly, it is possible to reduce the load required for design and production of the protrusion-recess structure in the protrusion-recess layer, compared with the case where the protrusion has a multistage shape.

In the above display, in each of the plurality of display elements, a pattern formed by the protrusion included in the protrusion-recess structure can be a pattern in which a first pattern composed of a group of the shape elements and a second pattern composed of a plurality of strip-shaped regions, which extend in the extending direction and are arranged in the width direction, are superimposed when the protrusion-recess structure is viewed in a direction perpendicular to the surface of the protrusion-recess layer, an arrangement interval of the strip-shaped regions in the width direction in the second pattern may not be constant among the plurality of strip-shaped regions, and an average arrangement interval of the plurality of strip-shaped regions may be one-half of more of a minimum wavelength in a wavelength range included in incident light, and the protrusion included in the protrusion-recess structure may have a multistage shape in which a protrusion element having a height specific to each display element, whose projected image in a lamination direction of the protrusion-recess layer and the multilayer film layer is an element constituting the first pattern, and a protrusion element having a height specific to each display element, whose projected image in the lamination direction is an element constituting the second pattern, are laminated in a height direction.

With this configuration, the diffusion effect and diffraction effect of the reflected light is obtained by the protrusion, and in each of the display elements, light of a specific wavelength range is observed in a wide angular range as light reflected by the multilayer film layer. Further, since the intensity of the reflected light is increased, bright and vivid colors are visually recognized.

A method for producing a display including a plurality of display elements having a first display element and a second display element, the method includes: a first step of transferring a protrusion and a recess of an intaglio plate to a resin by using a nanoimprinting technique to form a protrusion-recess layer having a protrusion-recess structure on a surface, in which the protrusion-recess structure of a portion included in the first display element and a portion included in the second display element in the protrusion-recess layer are simultaneously formed, and a second step of forming a multilayer film layer on the protrusion-recess structure such that adjacent layers in a plurality of layers included in the multilayer film layer have refractive indices that are different from each other, and light of a specific wavelength range in incident light that is incident on the multilayer film layer has reflectivity higher than the reflectivity of light of other wavelength ranges, wherein, in the first step, in a portion of the protrusion-recess layer included in each of the display elements, a protrusion included in the protrusion-recess structure has a shape having at least one step on a surface of the protrusion-recess layer, the protrusion-recess structure is formed such that, when the protrusion-recess structure is viewed in a direction perpendicular to the surface of the protrusion-recess layer, a pattern formed by the protrusion includes a pattern composed of a group of a plurality of shape elements extending in one extending direction, each of the shape elements has a length in the extending direction which is larger than a length in a width direction perpendicular to the extending direction, the length in the width direction being equal to or less than a sub-wavelength, and the plurality of shape elements has a standard deviation of the length in the extending direction which is larger than a standard deviation of the length in the width direction, and the protrusion-recess structure is formed such that the extending direction of a portion included in the first display element and the extending direction of a portion included in the second display element are different from each other.

According to the above method, since the protrusion-recess structure of the protrusion-recess layer is formed by nanoimprinting, a fine protrusion-recess structure can be produced in a suitable and simple manner. Since the protrusion-recess structure of a portion included in the first display element and a portion included in the second display element in the protrusion-recess layer are simultaneously formed, it is possible to reduce the load required for production of the protrusion-recess layer compared with the case where the protrusion-recess structure is formed for each of the display elements.

In the above method, the nanoimprinting may be photo-nanoimprinting or thermal nanoimprinting. According to the above method, since photo-nanoimprinting or thermal nanoimprinting is used as the nanoimprinting method, it is possible to form the protrusion-recess structure by nanoimprinting in a suitable and simple manner.

Advantageous Effects of the Invention

According to the present invention, designability of the display can be improved.

BRIEF DESCRIPTION OF THE DRAWINGS

FIG. 10A is a view illustrating an observation position relative to the display in an embodiment of the display.

FIG. 10B is a view illustrating an image visually recognized when observed from a position PA in FIG. 10A in an embodiment of the display.

FIG. 10C is a view illustrating an image visually recognized when observed from a position PB in FIG. 10A in an embodiment of the display.

DETAILED DESCRIPTION

Figure 1:
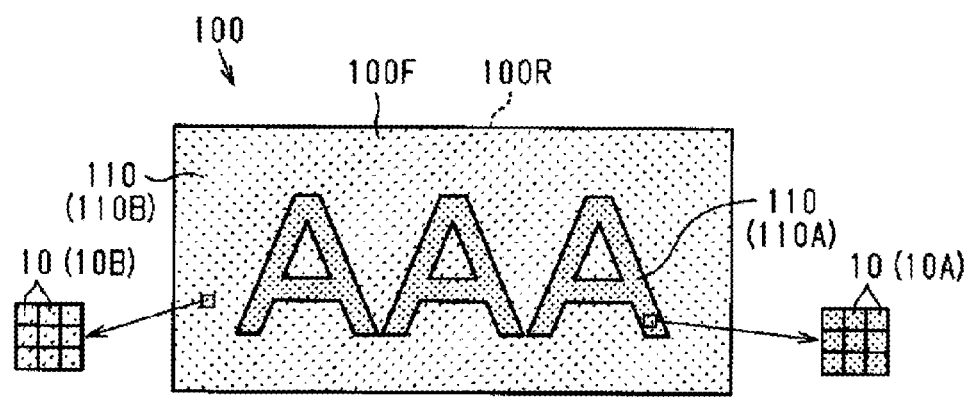
FIG. 1 is a view illustrating a plan structure of a display in an embodiment of the display.

With reference to the drawing, a description will now be given of a representative embodiment according to the present invention. The present invention is not limited to the following representative embodiment, and appropriate modifications can be made without departing from the spirit of the present invention. The representative embodiment described below is merely an example of the present invention, and the design thereof could be appropriately changed by one skilled in the art. Here, the drawings are schematic, and the relationship between thickness and plane size, the ratio of the thickness of each layer, etc., are different from actual ones. The embodiment described below is merely an example of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

Referring to FIGS. 1 to 12, an embodiment of a display and a method of producing a display will be described.

[Overall Configuration of Display]

With reference to FIG. 1, an overall configuration of a display will be described. A display of the present embodiment may be used for the purpose of increasing product counterfeiting resistance or for the purpose of improving product designability or may be used for both purposes. For the purpose of increasing product counterfeiting resistance, a display is attached, for example, to authentication documents such as a passport and licenses, securities such as merchandise coupons and checks, cards such as credit cards and cash cards, and paper money. For the purpose of improving product designability, a display is attached, for example, to wearable accessories, products carried around by users, stationary goods such as household furniture and home electric appliances, structures such as walls and doors, and interiors and exteriors of automobiles.

As shown in FIG. 1, a display 100 has a front surface 100F and a rear surface 100R that is a surface opposite to the front surface 100F. The display 100, when viewed in a direction perpendicular to the front surface 100F, includes a display region 110 in which pixels 10 are located. The display region 110 includes a first display region 110A and a second display region 110B. The first display region 110A is a region in which a plurality of first pixels 10A are located, and a second display region 110B is a region in which a plurality of second pixels 10B are located.

The first display region 110A and the second display region 110B may be used alone, or two or more of these regions may be used in combination to represent a character, symbol, figure, pattern, design, and background therefor. For example, in a configuration shown in FIG. 1, the first display region 110A is used to represent a character "A", and the second display region 110B is used to represent a background therefor.

[Configuration of Pixel]

The pixel 10 of the present embodiment is a protrusion-recess structure having a multilayer film layer. The protrusion-recess structure of the pixel 10 can be implemented by either a first structure or a second structure. Each of these structures will be described below.

Although the wavelength range of the light incident on and reflected from the pixel 10 is not specifically limited, the following description will be given, as an example, of the pixel 10, for light in the visible range. In the present embodiment, the wavelength range of 360 nm or more and 830 nm or less is taken as light in the visible range.

<First Structure>

Figure 2:
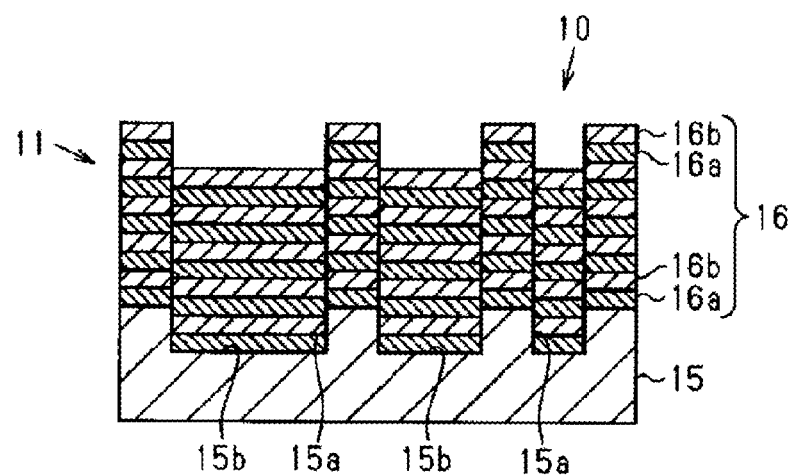
FIG. 2 is a view illustrating a cross-sectional structure of a pixel having a first structure in an embodiment of the display.

FIG. 2 illustrates a protrusion-recess structure 11, which is a pixel 10 having the first structure. The protrusion-recess structure 11 is made of material that transmits light in the visible range, and includes a substrate 15, which is an example of a protrusion-recess layer having a protrusion-recess surface, and a multilayer film layer 16 laminated on the surface of the substrate 15. That is, the multilayer film layer 16 covers the protrusion-recess surface of the substrate 15. The substrate 15 and the multilayer film layer 16 are laminated in the direction perpendicular to the front surface 100F of the display 100.

The protrusion-recess structure of the substrate 15 is formed of a plurality of protrusions 15a and recesses 15b, which are regions between the plurality of protrusions 15a. The protrusions 15a are formed of a plurality portions having a substantially strip shape with irregular length.

The multilayer film layer 16 has a structure in which high refractive index layers 16a and low refractive index layers 16b are alternately laminated. The high refractive index layer 16a has a refractive index larger than that of the low refractive index layer 16b. For example, the high refractive index layer 16a is in contact with the surface of the substrate 15, while the low refractive index layer 16b forms a surface of the multilayer film layer 16 on a side opposite to that facing the substrate 15.

The configurations of the multilayer film layer 16, that is, material, film thickness, and lamination order of the respective layers constituting the multilayer film layer 16, on the protrusions 15a and on the recesses 15b of the substrate 15 coincide with each other. The surface of the multilayer film layer 16 on a side opposite to that facing the substrate 15 has a shape that follows the protrusion-recess structure of the substrate 15, in other words, has protrusions and recesses that follow the protrusions and recesses formed on the substrate 15.

According to this structure, when light is incident on the protrusion-recess structure 11 through the surface of the multilayer film layer 16, light reflected by each interface between the high refractive index layer 16a and the low refractive index layer 16b of the multilayer film layer 16 causes interference, and thus changes its traveling direction due to the irregular protrusions and recesses on the surface of the multilayer film 16. As a result, light of a specific wavelength range is emitted in a wide angular range. The specific wavelength range of light strongly emitted as the reflected light is determined by the material and film thickness of the high refractive index layers 16a and the low refractive index layers 16b, as well as the width, height and arrangement of the protrusions 15a.

Further, the surface of the multilayer film layer 16 contacting with the substrate 15 also has the same protrusions and recesses as those on the surface of the multilayer film layer 16. Accordingly, when light is incident on the protrusion-recess structure 11 through the substrate 15, light of a specific wavelength range is emitted in a wide angular range. Therefore, the protrusion-recess structure 11 can be observed via either the multilayer film layer 16 or the substrate 15. In other words, the multilayer film layer 16 may be located closer to the front surface 100F of the display 100 while the substrate 15 is located closer to the rear surface 100R, or alternatively, the substrate 15 may be located closer to the front surface 100F of the display 100, while the multilayer film layer 16 is located closer to the rear surface 100R.

Figure 3A:
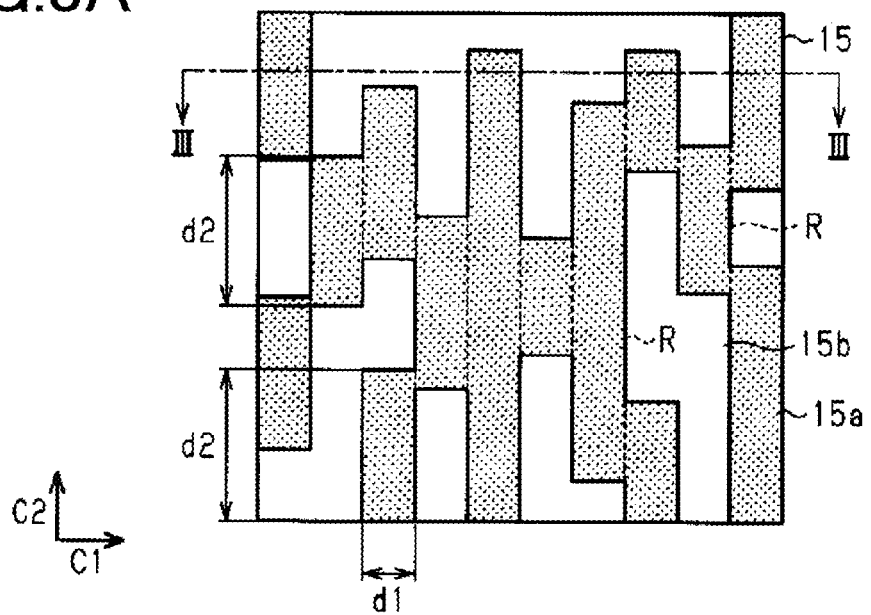
FIG. 3A is a view illustrating a plan structure of a protrusion-recess structure of the first structure in an embodiment of the display.
Figure 3B:
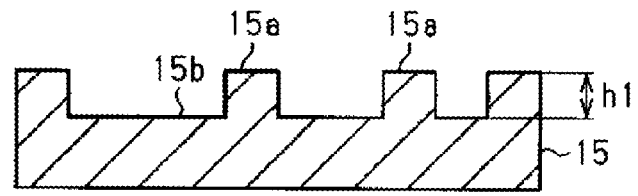
FIG. 3B is a view illustrating a cross-sectional structure of the protrusion-recess structure of the first structure in an embodiment of the display, which is a cross-sectional view taken along the line of FIG. 3A.

Referring to FIGS. 3A and 3B, details of the protrusion-recess structure of the substrate 15, which is a protrusion-recess layer, will be described below. FIG. 3A is a plan view as viewed in a direction perpendicular to the surface of the substrate 15, and FIG. 3B is a cross-sectional view illustrating a cross-sectional structure of the substrate 15 taken along the line of FIG. 3A. In FIG. 3A, the protrusions 15a constituting the protrusion-recess structure are shown dotted.

As shown in FIG. 3A, when viewed in the direction perpendicular to the substrate 15, a pattern formed by the protrusions 15a is a pattern formed by a group of a plurality of rectangles R, which are indicated by the dotted pattern. The rectangle R is an example of a shape element. The rectangle R has a shape extending in one direction, and the extending direction of the rectangle R, that is, the long side direction of the rectangle R is an extending direction C2, and a direction perpendicular to the extending direction C2, that is, the short side direction of the rectangle R is a width direction C1. The width direction C1 and the extending direction C2 are directions included in a plane parallel with the front surface 100F of the display 100.

In the rectangle R, a length d2 in the extending direction C2 is larger than a length d1 in the width direction C1. The plurality of rectangles R are arranged so as not to overlap with each other in either the width direction C1 or the extending direction C2.

In the plurality of rectangles R, the length d1 in the width direction C1 is constant. The plurality of rectangles R are arranged in the width direction C1 at an arrangement interval of the length d1, that is, a periodicity of the length d1.

Further, in the plurality of rectangles R, the length d2 in the extending direction C2 is not constant, and the length d2 of each rectangle R is a value selected from a population having a predetermined standard deviation. This population preferably follows a normal distribution. For example, a pattern of the plurality of rectangles R is formed, for example, temporarily placing the plurality of rectangles R with distribution with a predetermined standard deviation in a region for constituting the pixel 10, and then determining whether the respective rectangles R should be actually fixed or not at these locations according to a predetermined probability to thereby determine regions where the rectangles R should be located and where the rectangles R should not be located. In order to efficiently scatter the light reflected by the multilayer film layer 16, the length d2 preferably has a distribution with an average value of 4.15 µm or less and a standard deviation of 1 µm or less.

When the regions in which the rectangles R are positioned are regions for positioning the protrusions 15a, and the adjacent rectangles R are in contact with each other, one protrusion 15a is positioned in one region formed by combining the adjacent rectangles R. In such a configuration, the length of the protrusion 15a in the width direction C1 is an integral multiple of the length d1 of the rectangle R.

In order to prevent occurrence of rainbow spectrum due to protrusions and recesses, the length d1 of the rectangle R in the width direction C1 is not larger than the wavelength of the light in the visible range. In other words, the length d1 has a length which is equal to or less than a sub-wavelength, that is, equal to or less than a wavelength range of the incident light. That is, the length d1 is preferably 830 nm or less, and more preferably 700 nm or less. Furthermore, the length d1 is preferably smaller than the peak wavelength of light of the specific wavelength range reflected by the multilayer film layer 16. For example, the length d1 is preferably of the order of 300 nm when the pixel 10 displays a blue color, and preferably of the order of 400 nm when the pixel 10 displays a green color, and preferably of the order of 460 nm when the pixel 10 displays a red color.

In order to increase the spread of light reflected by the multilayer film layer 16, that is, to enhance the scattering effect of the reflected light, the protrusion-recess structure preferably has many asperities. When viewed in the direction perpendicular to the surface of the substrate 15, the area occupied by the protrusions 15a to the region constituting the pixel 10 is preferably in the range of 40% or more and 60% or less. For example, when viewed in the direction perpendicular to the surface of the substrate 15, the ratio of the area of the protrusions 15a to the area of the recesses 15b in the region constituting the pixel 10 is preferably 1:1.

For example, as shown in FIG. 3B, a height h1 of the protrusions 15a is constant, and can be set according to the color desired to be exhibited by the pixel 10, that is, the wavelength range desired to be reflected by the protrusion-recess structure 11. When the height h1 of the protrusion 15a is larger than the surface roughness of the multilayer film layer 16 on the protrusions 15a and the recesses 15b, the scattering effect of the reflected light can be obtained.

However, in order to prevent interference of light due to reflection by the protrusions and recesses of the surface of the multilayer film layer 16, the height h1 is preferably one-half or less of the wavelength of light in the visible range, that is, preferably in the range of 415 nm or less. Further, in order to prevent interference of light described above, the height h1 is more preferably one-half or less of the peak wavelength of light of the specific wavelength range reflected by the multilayer film layer 16.

Further, when the height h1 is excessively large, the scattering effect of the reflected light tends to be too high and the intensity of the reflected light tends to be low. Accordingly, when the reflected light is in the visible range, the height h1 is preferably 10 nm or more and 200 nm or less. For example, in the pixel 10 that exhibits a blue color, the height h1 is preferably 40 nm or more and 150 nm or less in order to obtain an effective spread of light, and the height h1 is preferably not more than 100 nm in order to prevent the scattering effect from being too high.

In addition, the rectangles R can also be arranged to form the pattern of the protrusions 15a in a manner such that two adjacent rectangles R arranged in the width direction C1 are partially overlapped with each other. In other words, the plurality of rectangles R may be arranged in the width direction C1 at an arrangement interval smaller than the length d1, and the arrangement interval of the rectangles R may not be necessarily constant. At the position where the rectangles R are overlapped with each other, one protrusion 15a is positioned in one region in which the regions of the rectangles R are combined. In this case, the length of the protrusion 15a in the width direction C1 is different from an integral multiple of the length d1 of the rectangle R. Further, the length d1 of the rectangle R may not be necessarily constant. The length d2 of the rectangle R may be larger than the length d1, and the standard deviation of the lengths d2 of the plurality of rectangles R may be larger than the standard deviation of the lengths d1. With this configuration as well, the reflected light scattering effect can be obtained.

Further, in production of the pixel 10, it is also possible, for example, to collectively form a protrusion in the shape of the pattern made up of the plurality of the rectangles R in a region having a large area, and then divide the protrusion by cutting or the like into the protrusion-recess structure of the respective pixels 10. This production method is preferred in view of ease of production. As a result of dividing the protrusions, some of the protrusions constituting the rectangle R at the end portion in some of the pixels 10 may have the length d2 in the extending direction C2 smaller than the length d1 in the width direction C1. However, even if such rectangles R are included in the pattern of the protrusions 15a, the optical effect thereof is insignificantly small when the number of such rectangles R is sufficiently small.

<Second Structure>

Figure 4:
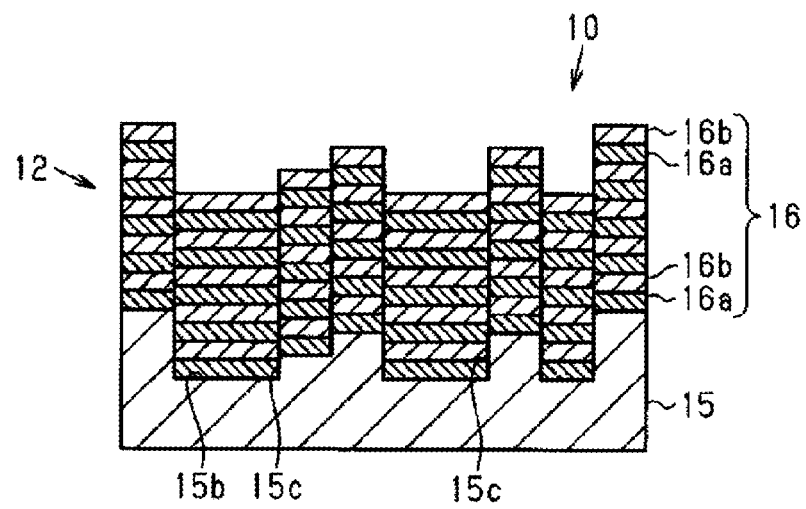
FIG. 4 is a cross-sectional view illustrating a cross-sectional structure of a pixel having a second structure in an embodiment of the display.

FIG. 4 illustrated a protrusion-recess structure 12, which is a pixel 10 having the second structure.

The protrusion-recess structure 12 having the second structure has the same configuration as that of the protrusion-recess structure 11 having the first structure except for a configuration of the protrusion-recess structure of the substrate 15, that is, a configuration of the protrusion-recess structure on the surface of the multilayer film layer 16. In the following description, the protrusion-recess structure 12 will be described focusing on the difference from the aforementioned protrusion-recess structure 11. The same components as those of the protrusion-recess structure 11 are denoted by the same reference signs and the description thereof is omitted.

In the protrusion-recess structure 12, protrusions 15c constituting the protrusion-recess structure of the substrate 15 include a first protrusion element having the same configuration as that of the protrusion 15a of the first structure and a second protrusion element extending in a strip shape, which are superimposed in the thickness direction of the substrate 15.

In the protrusion-recess structure 11 of the first structure, although a change in the observation angle of the observed color due to the scattering effect of the reflected light is small, the vividness of the color visually recognized decreases since the intensity of the reflected light decreases due to scattering. Depending on the application or the like of the display 100, there may be a case where the pixel 10 is demanded as a structure that enables more vivid colors to be observed in a wide angular range. In the second structure, the second protrusion elements are arranged to allow the incident light to be strongly diffracted in a specific direction. Accordingly, due to the light scattering effect of the first protrusion elements and light diffraction effect of the second protrusion elements, a structure that enables more vivid colors to be observed in a wide angular range is provided.

Figure 5A:
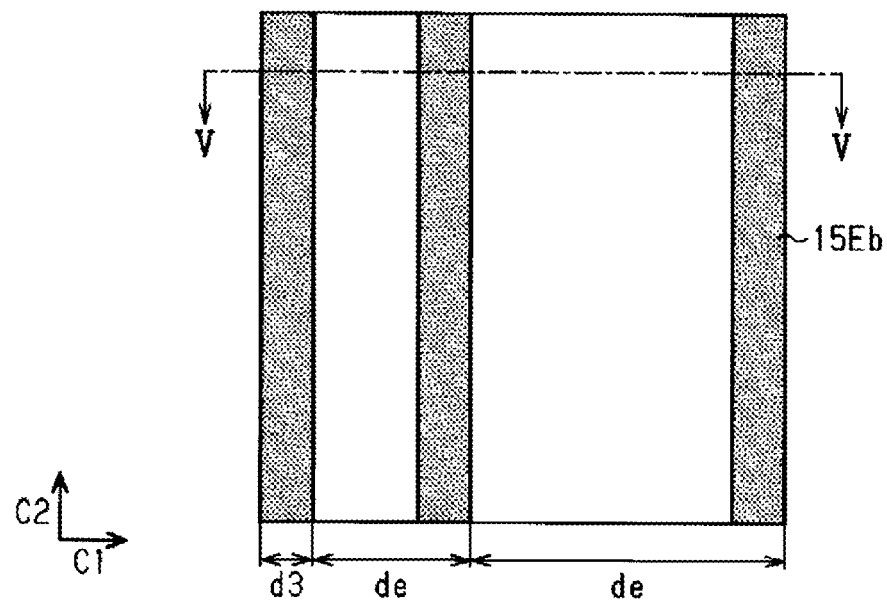
FIG. 5A is a view illustrating a plan structure of a protrusion-recess structure formed of only a second protrusion element in the second structure in an embodiment of the display.
Figure 5B:
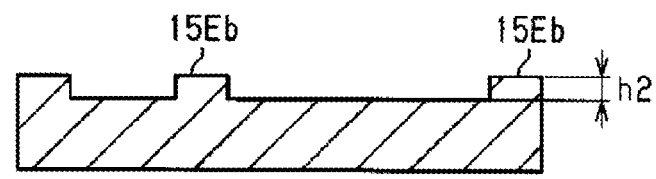
FIG. 5B is a view illustrating a cross-sectional structure of the protrusion-recess structure formed of only a second protrusion element in the second structure in an embodiment of the display, which is a cross-sectional view taken along the line V-V of FIG. 5A.

Referring to FIGS. 5A and 5B, the configuration of the second protrusion element will be described. FIG. 5A is a plan view of a protrusion-recess structure formed of only the second protrusion element, and FIG. 5B is a cross-sectional view illustrating a cross-sectional structure taken along the line V-V of FIG. 5A. In FIG. 5A, the second protrusion elements are shown dotted.

As shown in FIG. 5A, a second protrusion element 15Eb has a strip shape extending in the extending direction C2 with a constant width in plan view, and a plurality of second protrusion elements 15Eb are arranged with a space in the width direction C1. In other words, a pattern formed by the second protrusion elements 15Eb in plan view is a pattern formed of a plurality of strip regions extending in the extending direction C2 and arranged in the width direction C1. A length d3 of the second protrusion element 15Eb in the width direction C1 may be the same or different from the length d1 of the rectangle R that determines the pattern of the first protrusion element.

An arrangement interval de of the second protrusion elements 15Eb in the width direction C1, that is, an arrangement interval of the strip shapes in the width direction C1 is set to be equal to or larger than the length d3 so that at least part of the light reflected by the surface of the protrusion-recess structure, which is formed by the second protrusion elements 15Eb, is observed as first-order diffracted light. In other words, the first-order diffracted light is diffracted light whose diffraction order m is 1 or −1. That is, when an incident angle of the incident light is represented as θ, a reflection angle of reflected light is represented as φ, and a wavelength of diffraction light is represented as λ, the arrangement interval de satisfies de≥λ/(sin θ+sinφ). For example, when visible light with λ=360 nm is a target, the arrangement interval de of the second protrusion element 15Eb may be 180 nm or more, that is, the arrangement interval de may be one-half of more of the minimum wavelength in the wavelength range included in the incident light. Further, the arrangement interval de is a distance between the ends of two adjacent second protrusion elements 15Eb on the same side of the respective second protrusion elements 15Eb in the width direction C1.

The periodicity of the pattern formed by the second protrusion elements 15Eb corresponds to the periodicity of the protrusion-recess structure of the substrate 15, that is, the periodicity of the protrusion-recess structure on the surface of the multilayer film layer 16. When the arrangement interval de of the plurality of second protrusion elements 15Eb is constant, reflected light of a specific wavelength is emitted by the multilayer film layer 16 at a specific angle due to a diffraction phenomenon on the surface of the multilayer film layer 16. The reflection intensity of light due to this diffraction is stronger than the reflection intensity of the reflected light due to the scattering effect of light caused by the first protrusion element described in the aforementioned first structure. Accordingly, light having a metallic luster is visually recognized, while a spectrum due to the diffraction occurs, which causes the color visually recognized to change depending on the observation angle.

Therefore, for example, even if the structure of the first protrusion element is designed to enable the pixel 10 to exhibit a blue color, light in the range from strong green to red may be observed by surface reflection due to diffraction depending on the observation angle when the arrangement interval de of the second protrusion elements 15Eb is a specific value of the order of 400 nm to 5 μm. On the other hand, when the arrangement interval de of the second protrusion elements 15Eb is increased, for example, to the order of 50 μm, a change in color due to diffraction becomes less likely to be visually recognized since the angular range in which light in the visible range is diffracted is decreased. However, light having a metallic luster is observed only at a specific observation angle.

Therefore, when the pattern of the second protrusion elements 15Eb is formed as the pattern in which a plurality of structures having different periodicities are superimposed, instead of having the arrangement interval de of a constant value, light of a plurality of wavelengths is mixed with the light reflected due to diffraction. Accordingly, dispersed light with high monochromaticity is less likely to be visually recognized. As a result, bright and vivid colors are observed in a wide angular range. In this case, the arrangement interval de is selected from, for example, a range of 360 nm or more and 5 μm or less, and an average value of the arrangement interval de among the plurality of second protrusion elements 15Eb may be one-half of more of the minimum wavelength in the wavelength range included in the incident light.

However, with an increase in the standard deviation of the arrangement interval de, the arrangement of the second protrusion elements 15Eb becomes irregular and thus the scattering effect becomes dominant. Accordingly, strong reflection due to diffraction becomes less likely to occur. Therefore, the arrangement interval de of the second protrusion elements 15Eb is preferably determined depending on the angle at which light spreads due to the scattering effect of light by the first protrusion elements so that the light produced due to diffraction is emitted to an angular range substantially the same as the angular range for the above scattered light. For example, when blue reflected light is emitted with a spread within a range of ±40° with respect to the incident angle, the arrangement interval de in the pattern of the second protrusion elements 15Eb is set to have an average of the order of 1 μm or more and 5 μm or less, with a standard deviation of the order of 1 μm. Thus, light produced by diffraction is generated in an angular range substantially equal to the angular range to which light is scattered by the first protrusion element.

That is, unlike a structure for diffracting and extracting light of a specific wavelength range, a structure formed of the plurality of second protrusion elements 15Eb emits light of various wavelength ranges to a predetermined angular range by using diffraction resulting from dispersion of the arrangement interval de.

Further, in order to ensure diffraction phenomenon of a longer periodicity, each pixel 10 may be formed in a square region with a side of 10 μm or more and 100 μm or less, and, the arrangement interval de in the pattern of the second protrusion elements 15Eb in each pixel region may be set with an average of the order of 1 μm or more and 5 μm or less, with a standard deviation of the order of 1 μm. In addition, a plurality of pixel regions may include a region having a constant arrangement interval de which is within the range of 1 μm or more and 5 μm or less. Even if a pixel region having a constant arrangement interval de is included, the same effect as that of the configuration having an irregular arrangement interval de in all the pixel regions can be expected taking account of the resolution by the human eye, as long as the arrangement interval de varies with a standard deviation of the order of 1 μm.

Further, the second protrusion elements 15Eb shown in FIG. 5 has a periodicity corresponding to the arrangement interval de only in the width direction C1. Although the scattering effect of light by the first protrusion element mainly affects the light reflected in the direction parallel with the width direction C1 when viewed in the direction perpendicular to the surface of the substrate 15, it also partially affects the light reflected in the direction parallel with the extending direction C2. Accordingly, the second protrusion elements 15Eb may also have a periodicity in the extending direction C2. That is, the pattern of the second protrusion elements 15Eb may be a pattern in which a plurality of strip-shaped regions extending in the extending direction C2 are arranged in both the width direction C1 and the extending direction C2.

In such a pattern of the second protrusion elements 15Eb, for example, each of the arrangement interval in the width direction C1 and the arrangement interval in the extending direction C2 of the strip-shaped regions may vary with each average being 1 μm or more and 100 μm or less. Further, depending on the difference in the effect on the scattering effect of light in the width direction C1 and in the extending direction C2 by the first protrusion elements, the average of the arrangement interval in the width direction C1 and the average of the arrangement interval in the extending direction C2 may be different from each other, and the standard deviation of the arrangement interval in the width direction C1 and the standard deviation of the arrangement interval in the extending direction C2 may be different from each other.

As shown in FIG. 5B, a height h2 of the second protrusion element 15Eb may be larger than the surface roughness of the multilayer film layer 16 on the protrusion 15c or on the recess 15b. However, with an increase in the height h2, the diffraction effect due to the second protrusion elements 15Eb becomes dominant in the effect of the protrusion-recess structure to the reflected light, and thus the scattering effect of light due to the first protrusion elements becomes less likely to be achieved. Accordingly, the height h2 is preferably substantially the same as the height h1 of the first protrusion element, and the height h2 may also be equal to the height h1. For example, the height h1 of the first protrusion element and the height h2 of the second protrusion element 15Eb are preferably within the range of 10 nm or more and 200 nm or less. In the pixel 10 that exhibits a blue color, the height h1 of the first protrusion element and the height h2 of the second protrusion element 15Eb are preferably within the range of 10 nm or more and 150 nm or less.

Figure 6A:
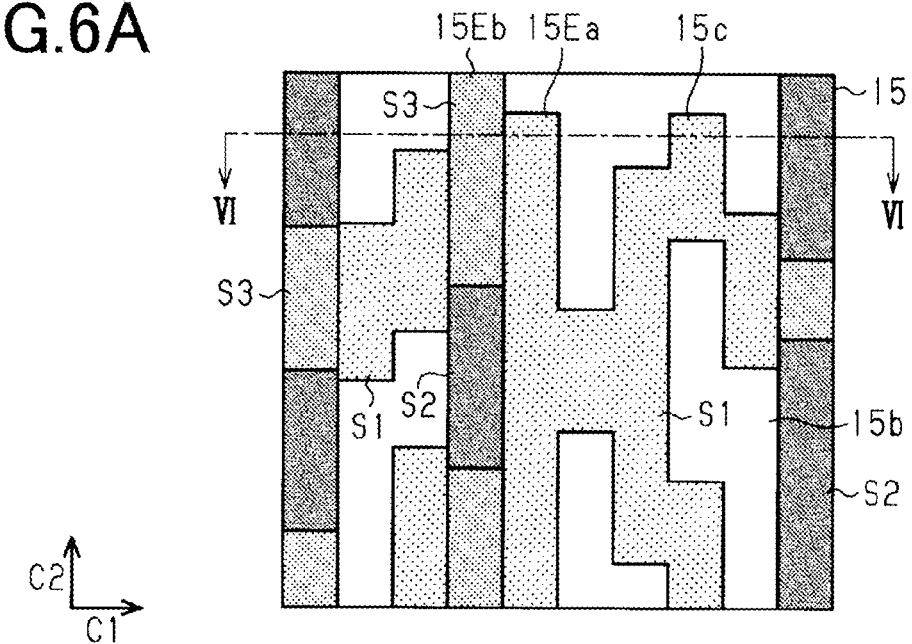
FIG. 6A is a view illustrating a plan structure of a protrusion-recess structure of the second structure in an embodiment of the display.
Figure 6B:
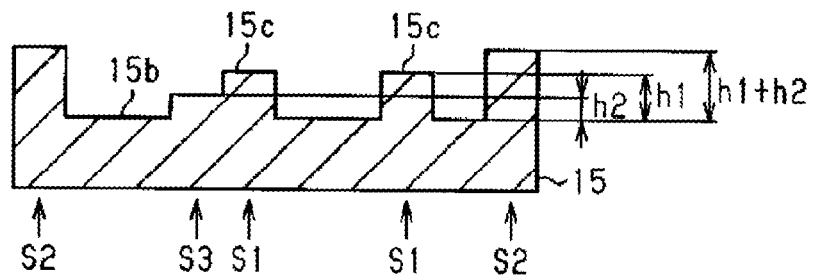
FIG. 6B is a view illustrating a cross-sectional structure of the protrusion-recess structure of the second structure in an embodiment of the display, which is a cross-sectional view taken along the line VI-VI of FIG. 6A.

Referring to FIGS. 6A and 6B, details of the protrusion-recess structure of the protrusion-recess structure 12 of the second structure will be described below. FIG. 6A is a plan view as viewed in a direction perpendicular to the surface of the substrate 15, and FIG. 6B is a cross-sectional view illustrating a cross-sectional structure of the substrate 15 taken along the line VI-VI of FIG. 6A. In FIG. 6A, a pattern formed by the first protrusion elements and a pattern formed by the second protrusion elements are indicated by dots with different densities.

As shown in FIG. 6A, when viewed in the direction perpendicular to the surface of the substrate 15, a pattern formed by the protrusions 15c includes a first pattern formed by a first protrusion element 15Ea and a second pattern formed by a second protrusion element 15Eb. That is, a region in which the protrusions 15c are located includes a region S1 that is formed only by the first protrusion element 15Ea, a region S2 in which the first protrusion element 15Ea and the second protrusion element 15Eb are overlapped, and a region S3 that is formed only by the second protrusion element 15Eb. In FIG. 6A, the first protrusion element 15Ea and the second protrusion element 15Eb are overlapped in the width direction C1 with the ends thereof aligned with each other. However, other configurations are also possible, and the end of the first protrusion element 15Ea and the end of the second protrusion element 15Eb may not be aligned.

As shown in FIG. 6B, in the region S1, the height of the protrusion 15c is a height h1 of the first protrusion element 15Ea. Further, in the region S2, the height of the protrusion 15c is the sum of the height h1 of the first protrusion element 15Ea and a height h2 of the second protrusion element 15Eb. Further, in the region S3, the height of the protrusion 15c is a height h2 of the second protrusion element 15Eb. Thus, the protrusion 15c has a multistage shape in which the first protrusion element 15Ea, having a predetermined height h1, whose projected image in the lamination direction of the substrate 15 and the multilayer film layer 16 forms the first pattern, and the second protrusion element 15Eb, having a predetermined height h2, whose projected image in the above lamination direction forms the second pattern, are laminated in the height direction.

As described above, according to the pixel 10 having the second structure, which causes the synergy effect of the light diffusion phenomenon due to the portion formed by the first protrusion element 15Ea and light diffraction phenomenon due to the portion formed by the second protrusion element 15Eb in the protrusion 15c, reflected light of a specific wavelength range can be observed in a wide angular range. Further, since the intensity of the reflected light is increased, bright and vivid colors are visually recognized. In other words, in the second structure, the protrusion 15c, which is one structure, performs both the light diffusion function and the light diffraction function.

In addition, when viewed in the direction perpendicular to the surface of the substrate 15, the pattern formed by the first protrusion element 15Ea and the pattern formed by the second protrusion element 15Eb may be positioned with the first protrusion element 15Ea and the second protrusion element 15Eb being not overlapped with each other. With this configuration, the light diffusion effect by the first protrusion element 15Ea and light diffraction effect by the second protrusion element 15Eb can also be obtained. However, when the first protrusion element 15Ea and the second protrusion element 15Eb are positioned so as not to be overlapped with each other, an area in which the first protrusion element 15Ea can be positioned per unit area is decreased compared with the first structure. Accordingly, the light diffusion effect is decreased. Hence, in order to improve the light diffusion effect and light diffraction effect of the protrusion elements 15Ea and 15Eb, the protrusion 15c is preferably provided as a multistage shape in which the first protrusion element 15Ea and the second protrusion element 15Eb are overlapped as shown in FIGS. 6A and 6B.

[Modified Example of Protrusion-recess Structure]

Figure 7:
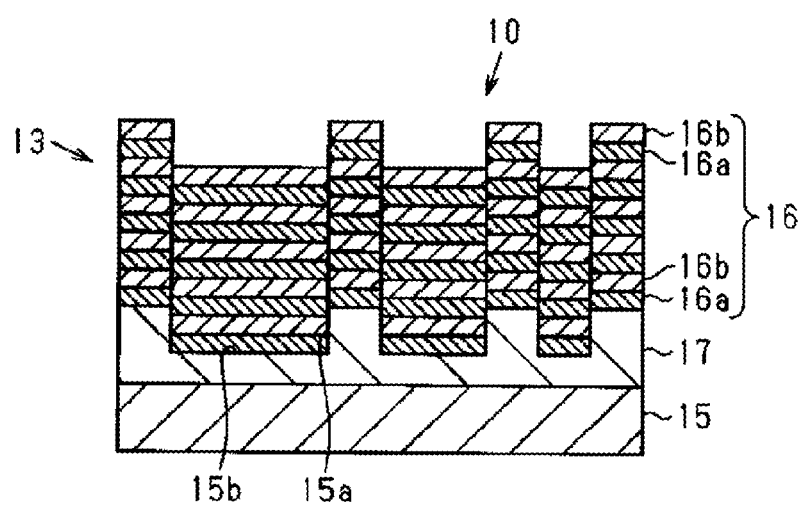
FIG. 7 is a view illustrating a cross-sectional structure of a pixel of a modified example in an embodiment of the display.

The protrusion-recess structure constituting the pixel 10 may also have a configuration shown in FIG. 7. The protrusion-recess structure 13 shown in FIG. 7 includes the substrate 15, a resin layer 17 that covers the surface of the substrate 15, and the multilayer film layer 16 laminated on the resin layer 17. The surface of the substrate 15 is flat, and the resin layer 17 provided on that surface has protrusions and recesses. In the form shown in FIG. 7, a laminate of the substrate 15 and the resin layer 17 provides a protrusion-recess layer. Either of a protrusion-recess structure of the first structure and a protrusion-recess structure of the second structure described above may be applied to the protrusion-recess structure on the surface of the resin layer 17.

Further, a protrusion pattern of the first structure and a protrusion pattern of the second structure may be different, for example, between the first pixel 10A and the second pixel 10B. For example, the average and standard deviation of the length d1 and the length d2 of the plurality of rectangles R constituting the pattern of the protrusion 15a in the first structure is determined for each of the pixels 10. The pattern of the protrusion may be the same or different among the pixels 10. The size of the pixel 10, that is, an area constituting the pixel 10 as viewed in the direction perpendicular to the front surface 100F of the display 100, may be determined according to a desired resolution of an image to be formed in the display region 110. In the pattern formed by the aforementioned rectangles R, for appropriate distribution of the length d2 of the plurality of rectangles R in an extending direction C2a, a region constituting the pixel 10 preferably has a square shape with a side of 10 μm or more.

[Configuration of Display Region]

Figure 8:
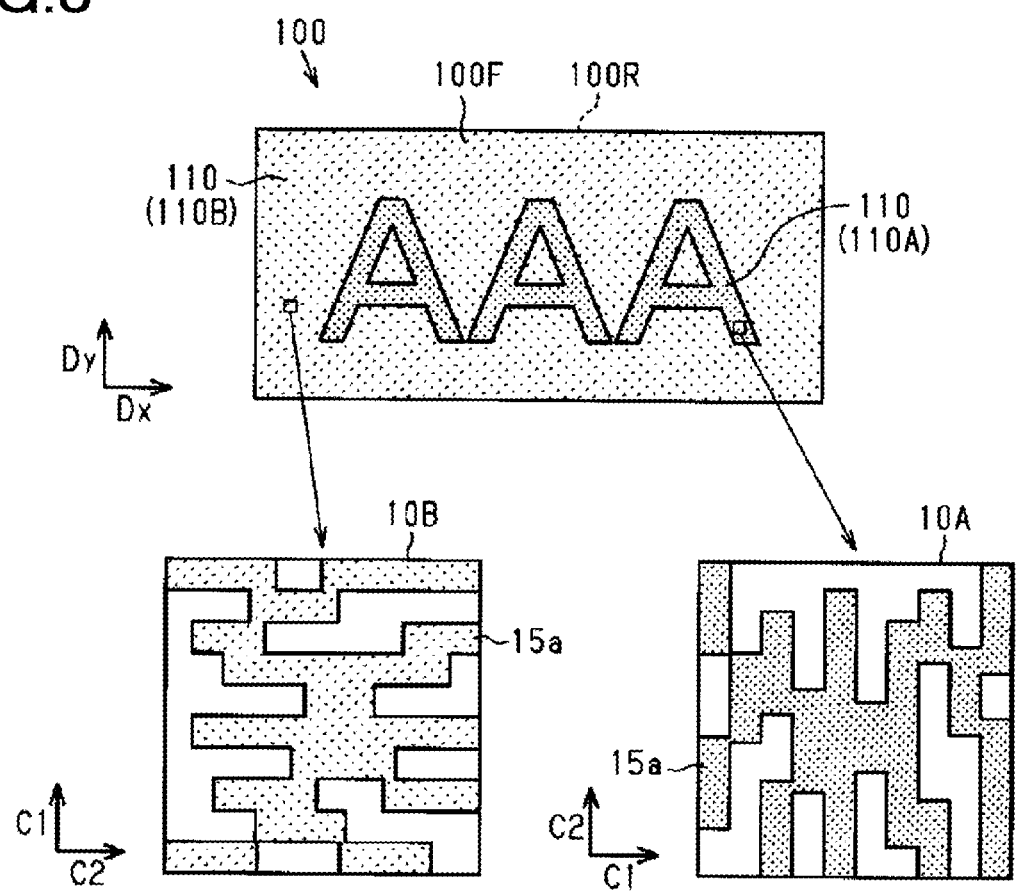
FIG. 8 is a view illustrating arrangement of the protrusion-recess structure in the first pixel and arrangement of the protrusion-recess structure in the second pixel in an embodiment of the display.

Referring to FIGS. 8 to 10, details of arrangement of the first pixels 10A in the first display region 110A and arrangement of the second pixels 10B in the second display region 110B, and the effects of the display 100 of the present embodiment, will be described. FIG. 8 illustrates an example in which the protrusion-recess structure 11 of the first structure described above is applied to the pixel 10.

As shown in FIG. 8, a first direction Dx and a second direction Dy are directions extending parallel with the front surface 100F of the display 100, and the first direction Dx and the second direction Dy are perpendicular to each other. The first pixels 10A are arranged such that the width direction C1 of the protrusion-recess structure is taken as the first direction Dx and the extending direction C2 is taken as the second direction Dy. On the other hand, the second pixels 10B are arranged such that the width direction C1 of the protrusion-recess structure is taken as the second direction Dy and the extending direction C2 is taken as the first direction Dx. That is, the extending direction C2 in the first pixel 10A and the extending direction C2 in the second pixel 10B are different from each other, and more specifically, perpendicular to each other.

Figure 9A:
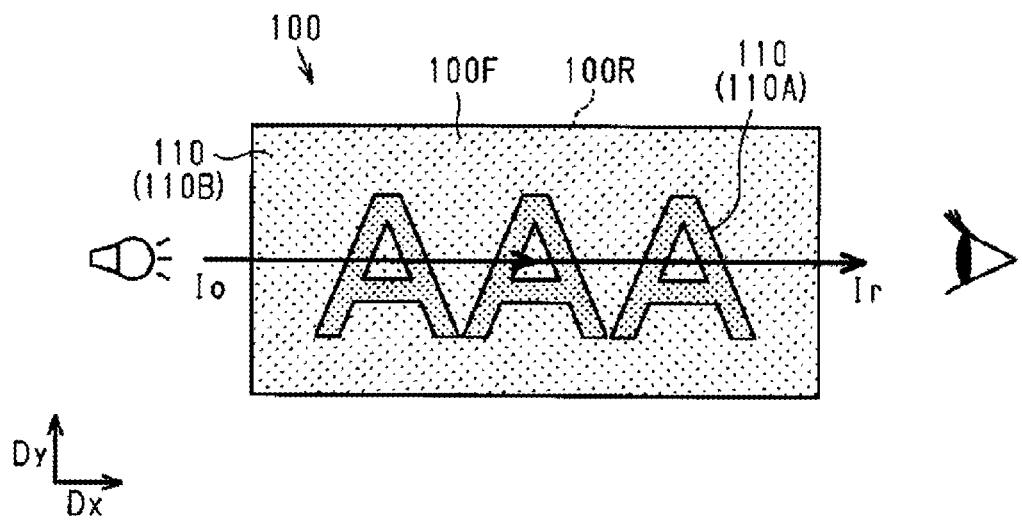
FIG. 9A is a view illustrating directions of incident light and reflected light in an embodiment of the display when viewed in a direction facing a front surface of the display.
Figure 9B:
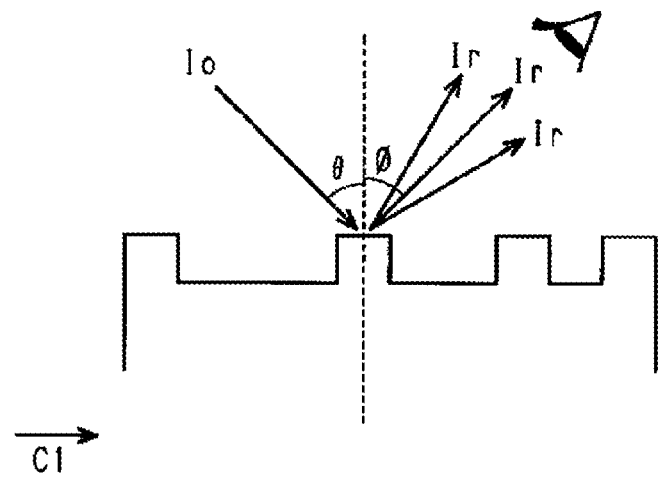
FIG. 9B is a view illustrating directions of incident light and reflected light in an embodiment of the display when viewed in a direction facing a cross-section of the display.

With reference to FIGS. 9A, 9B and FIGS. 10A to 10C, an image visually recognized on the display 100 having the above arrangement of the pixel 10 will be described. FIG. 9A is a view illustrating directions of incident light and reflected light in the display when viewed in a direction facing the front surface 100F of the display 100, and FIG. 9B is a view illustrating directions of incident light and reflected light in the display 100 when viewed in a direction facing the cross-section in the thickness direction of the display 100. Further, FIG. 9B illustrates a simplified light path, and the traveling path of the incident light and the reflected light in the multilayer film layer 16 and a change in the traveling path due to scattering are not illustrated. Further, FIGS. 10A to 10C are views illustrating an observation position of an observer relative to the display 100, and an image observed from each observation position.

In the pixel 10, the scattering effect on light due to the protrusion mainly acts on the reflected light traveling in the direction parallel with the width direction C1, when viewed in the direction perpendicular to the front surface 100F of the display 100, in other words, when the light path is projected in a plane parallel with the front surface 100F.

More specifically, with reference to FIG. 9A, in which the pixel 10 has the width direction C1 as the first direction Dx, the multilayer film layer 16 of the pixel 10 receives incident light Io that is incident on the pixel 10 in the width direction C1 and emits reflected light Ir that is emitted in the width direction C1 when viewed in the direction perpendicular to the front surface 100F. When the multilayer film layer 16 is disposed on a flat surface, reflected light of a specific wavelength range which has been intensified by interference at each interface in the multilayer film layer 16 is emitted, as shown in FIG. 9B, only in the specular reflection direction at which the incident angle θ, which is an angle formed between the incident direction of the incident light Io and the lamination direction of the multilayer film layer 16, becomes equal to the reflection angle φ, which is an angle formed between the emission direction of the reflected light Ir and the lamination direction.

On the other hand, in the pixel 10 of the present embodiment, reflected light is scattered due to irregularities of the protrusion-recess structure of the pixel 10. Accordingly, the reflected light Ir of a specific wavelength range which has been intensified by interference is emitted from the pixel 10 so as to travel in each direction at the reflection angle φ within the angular range larger than the incident angle θ, rather than only into the direction at the angle of the absolute value equal to the incident angle θ. The pixel 10 has the protrusion-recess structure in which the width of the protrusions and recesses vary in a different manner in the width direction C1 and the extending direction C2, and has the entire structure extending in the extending direction C2. Accordingly, when viewed in the direction perpendicular to the front surface 100F, the reflected light Ir is scattered in the direction parallel with the width direction C1, in other words, scattered in a manner that the reflection angle φ expands within the direction parallel with the width direction C1. Thus, reflected light of a specific wavelength range having anisotropy in the width direction C1 is emitted from the pixel 10.

Accordingly, as shown in FIG. 10A, when the front surface 100F of the display 100 is observed from a position PA at which the reflected light in the first direction Dx is observed, light reflected by the first pixel 10A having the first direction Dx as the width direction C1 is visually recognized, while the light from the second pixel 10B is extremely weak. Accordingly, as shown in FIG. 10B, a color of a specific color hue corresponding to the wavelength range of the reflected light appears bright in the first display region 110A, while the second display region 110B appears dark.

On the other hand, as shown in FIG. 10A, when the front surface 100F of the display 100 is observed from a position PB at which the reflected light in the second direction Dy is observed, light reflected by the second pixel 10B having the second direction Dy as the width direction C1 is visually recognized, while the light from the first pixel 10A is extremely weak. Accordingly, as shown in FIG. 10C, a color of a specific color hue corresponding to the wavelength range of the reflected light appears bright in the second display region 110B, while the first display region 110A appears dark.

As described above, according to the display 100 of the present embodiment, reflected light of a specific wavelength range having anisotropy is emitted from the pixel 10 due to the arrangement of protrusions and recesses of the pixel 10. That is, reflected light of a specific wavelength range emitted from the pixel 10 is observed at a specific position, which is a clear image position, among the observer's positions relative to the display 100 in the plane parallel with the front surface 100F, in other words, among the observer's observation positions projected to the plane parallel with the front surface 100F. Therefore, since the protrusions and recesses in the pixel 10 have different arrangement directions between the first display region 110A and the second display region 110B, the clear image positions for the respective display regions 110 may be different so that the observer can visually recognize different images depending on the difference in observation position.

Accordingly, designability of the display 100 can be improved, and thus the counterfeiting prevention effect can also be improved when the display 100 is used for improving counterfeiting resistance.

In particular, the intensity of light observed as light from the pixel 10 is high at a specific clear image position but is extremely low at positions other than the clear image position. Compared with the pixel 10 of the present embodiment, for example, when the multilayer film layer 16 is disposed on a flat surface in the display 100, reflected light of a specific wavelength range which has been intensified by interference is emitted only in the specular reflection direction, and reflected light can be emitted in the specular reflection direction of the incident light when light is incident from any direction. As a result, the color hue that is visually recognized varies depending on the change in observation angle, which is the angle formed between the front surface 100F of the display 100 and the gaze direction of the observer, while the position where such reflected light can be observed is not limited among the above observation positions. In contrast, according to the pixel 10 of the present embodiment, by virtue of the scattering effect of the reflected light having anisotropy attributed to the protrusion-recess structure, reflected light of a specific wavelength range, that is, color of a specific color hue is observed in a wide angular range from a specific observation position.

Therefore, compared with a case where a configuration in which the multilayer film layer 16 is disposed on a flat surface is applied to one of the first display region 110A and the second display region 110B, it is possible to emphasize the difference in contrast between the first display region 110A and the second display region 110B to thereby form an image with a clear difference in brightness using the display 100.

[Configuration Example of Display]

A configuration example that is suitable for the configuration of the display 100 having the above effect will be described.

<Configuration Including Boundary Region>

Figure 11:
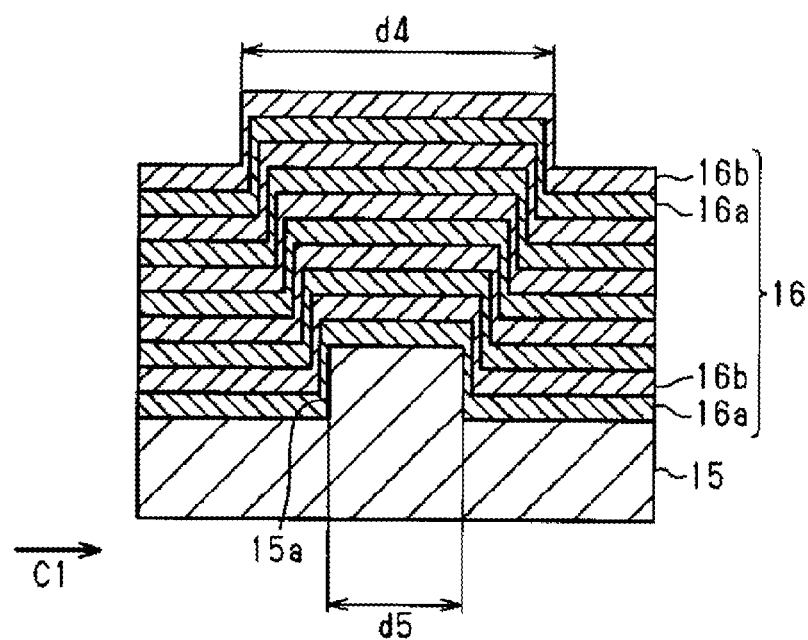
FIG. 11 is an enlarged cross-sectional view illustrating a multilayer film layer laminated adjacent to a protrusion of a protrusion-recess layer in an exemplary configuration in an embodiment of the display.

As shown in FIG. 11, the multilayer film layer 16 is also formed, specifically, on a side surface of the protrusion in the protrusion-recess layer. Accordingly, in the width direction C1, a length d4 of the protrusion in the protrusion-recess structure on the surface of the multilayer film layer 16 is slightly larger than a length d5 of the protrusion in the protrusion-recess layer. When the protrusion of the multilayer film layer 16 in the first pixel 10A and the protrusion of the multilayer film layer 16 in the second pixel 10B are connected in a portion where the first display region 110A and the second display region 110B are in contact with each other, that is, a portion where the first pixel 10A and the second pixel 10B having different extending directions C2 are adjacent to each other, the shape originally intended for the protrusion-recess structure of the multilayer film layer 16 is modified. As a result, diffusion effect of the reflected light having a desired color development and anisotropy in a desired direction becomes difficult to achieve at the end of the respective pixels 10, and formation of a precise image in the display 100 may be disturbed.

Accordingly, the display 100 includes a boundary region, which is a region between the first pixel 10A and the second pixel 10B, that is, between the first display region 110A and the second display region 110B. In the boundary region, the multilayer film layer 16 is preferably disposed on a flat surface. Specifically, the protrusion-recess layer is continuous with the boundary region between the first display region 110A and the second display region 110B, and the multilayer film layer 16 is continuous with the first display region 110A, the boundary region, and the second display region 110B. Further, in the boundary region, protrusions and recesses are not formed in the protrusion-recess layer, and the surface of the protrusion-recess layer may be flat. According to this configuration, modification of the protrusion-recess structure attributed to an increase in width of the multilayer film layer 16 is reduced at the end of the pixel 10 located at the end of the display region 110 so that desired color development in a desired direction from the entire pixel 10 can be easily achieved. The boundary region may have, for example, a strip shape extending between the first display region 110A and the second display region 110B.

The degree of increase in width of the protrusion in the multilayer film layer 16, that is, a difference between the length d4 and the length d5 varies depending on the production method of the multilayer film layer 16. For example, when the multilayer film layer 16 is produced by vacuum vapor deposition, a layer having a thickness of the order of one-half of the entire film thickness of the multilayer film layer 16 is formed on the side surface of the protrusion in the protrusion-recess layer. Accordingly, the width of the boundary region, in other words, the minimum width of the boundary region in the direction in which the first display region 110A and the second display region 110B are arranged is preferably one-half or more of the film thickness of the multilayer film layer 16.

On the other hand, when the boundary region is of a size that is visually recognizable, a change in color hue of the color that is visually recognized varies depending on the observation angle when the light reflected by the multilayer film layer 16 in the boundary region is visually recognized. In order to reduce such a phenomenon, the above boundary region preferably has a maximum width of 50 μm or less.

In addition, in the same display region 110, a region in which protrusions and recesses are not formed in the protrusion-recess structure may also be provided between the first pixels 10A and between the second pixels 10B. According to such a configuration, modification attributed to an increase in width of the multilayer film layer 16 is reduced at the end of the pixel 10 so that a desired color development tends to be obtained from the entire pixel 10.

Further, a configuration in which the boundary region is visually recognizable enables the display to form a variety of images. This configuration will be described below.

Figure 12A:
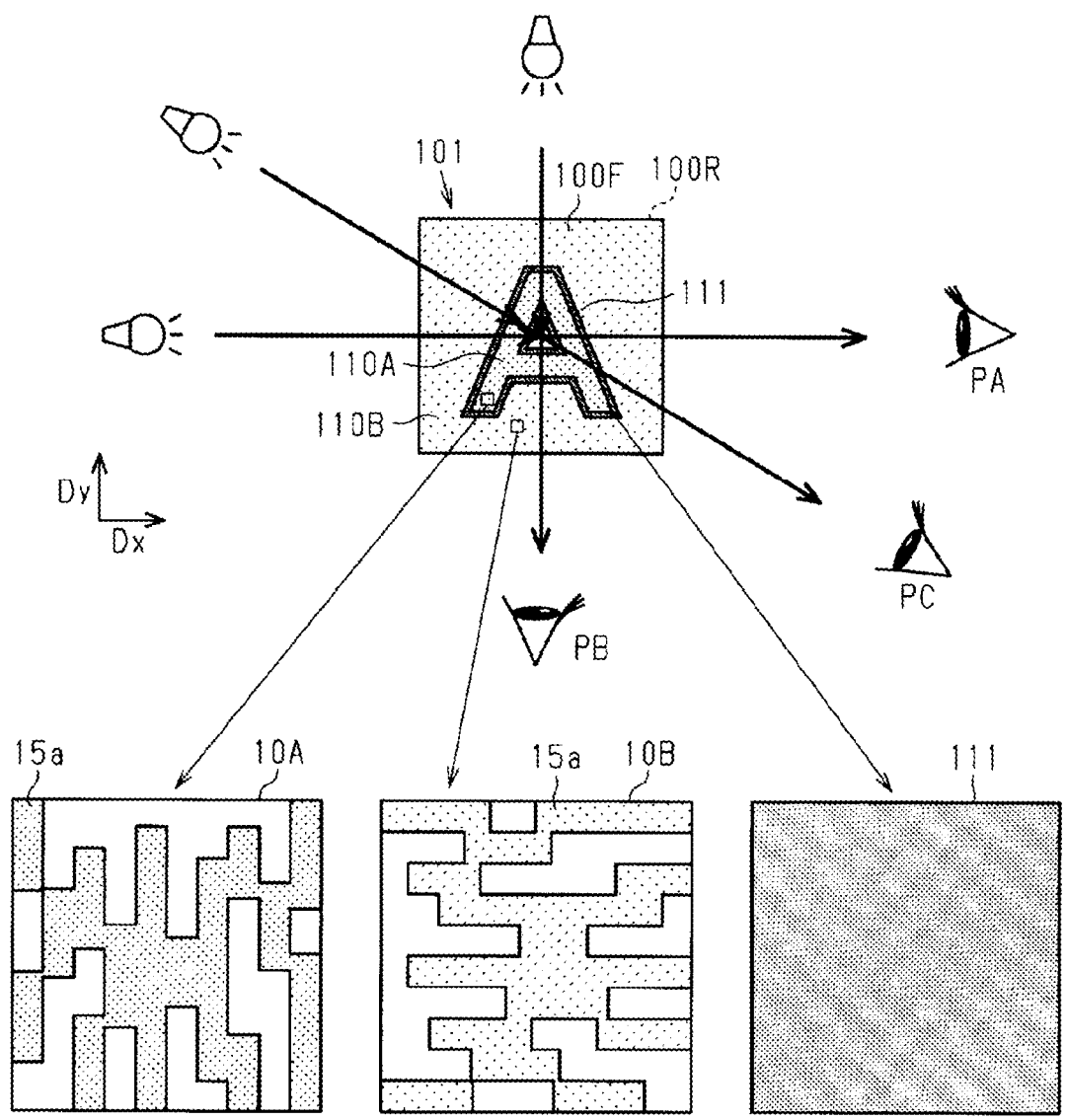
FIG. 12A is a view illustrating an arrangement of the protrusion-recess structure and an observation position relative to the display in an exemplary configuration in an embodiment of the display.

The display 101 shown in FIG. 12A includes, when viewed in the direction perpendicular to the front surface 100F, a boundary region 111 in addition to the first display region 110A and the second display region 110B having the same configuration as that of the above display 100. That is, the boundary region 111 is located between the first display region 110A and the second display region 110B.

The first pixels 10A constituting the first display region 110A are arranged such that the width direction C1 of the protrusion-recess structure is taken as the first direction Dx and the extending direction C2 is taken as the second direction Dy. The second pixels 10B constituting the second display region 110B are arranged such that the width direction C1 of the protrusion-recess structure is taken as the second direction Dy and the extending direction C2 is taken as the first direction Dx. In the boundary region 111, protrusions and recesses are not formed on the substrate 15 and the resin layer 17, and the multilayer film layer 16 is disposed on a flat surface.

In the above configuration, when the front surface 100F of the display 101 is observed from a position PA at which the reflected light in the first direction Dx is observed, light reflected by the first pixel 10A having the first direction Dx as the width direction C1 is visually recognized, while the light from the second pixel 10B is extremely weak. Further, depending the observation angle, light reflected by the multilayer film layer 16 in the specular reflection direction is visually observed at the boundary region 111.

Figure 12B:
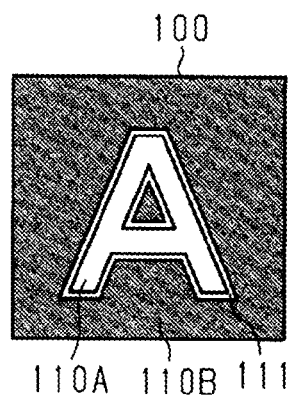
FIG. 12B is a view illustrating an image visually recognized when observed from a position PA in FIG. 12A in an exemplary configuration in an embodiment of the display.

Accordingly, as shown in FIG. 12B, a color of a specific color hue corresponding to the wavelength range of the reflected light appears bright in the first display region 110A, while the second display region 110B appears dark. Further, the color of the boundary region 111 appears to change greatly depending on the observation angle.

Further, as shown in FIG. 12A, when the front surface 100F of the display 101 is observed from a position PB at which the reflected light in the second direction Dy is observed, light reflected by the second pixel 10B having the first direction Dy as the width direction C1 is visually recognized, while the light from the first pixel 10A is extremely weak. Further, depending the observation angle, light reflected by the multilayer film layer 16 in the specular reflection direction is visually observed at the boundary region 111.

Figure 12C:
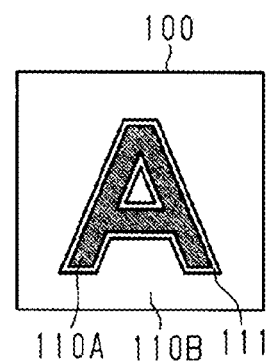
FIG. 12C is a view illustrating an image visually recognized when observed from a position PB in FIG. 12A in an exemplary configuration in an embodiment of the display.

Accordingly, as shown in FIG. 12C, a color of a specific color hue corresponding to the wavelength range of the reflected light appears bright in the second display region 110B, while the first display region 110A appears dark. Further, the color of the boundary region 111 appears to change greatly depending on the observation angle.

Further, as shown in FIG. 12A, when the front surface 100F of the display 101 is observed from the position PC, which is different from the position PA and the position PB, that is, at the position PC from which the reflected light in the direction different from the first direction Dx and the second direction Dy is observed, both light from the first pixel 10A and light from the second pixel 10B are extremely weak. On the other hand, depending the observation angle, light reflected by the multilayer film layer 16 in the specular reflection direction is visually observed at the boundary region 111.

Figure 12D:
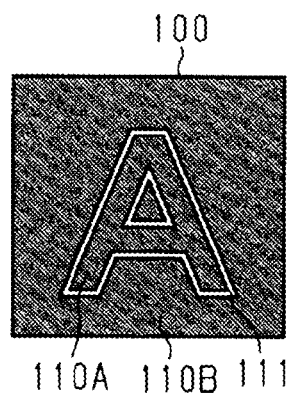
FIG. 12D is a view illustrating an image visually recognized when observed from a position PC in FIG. 12A in an exemplary configuration in an embodiment of the display.

Accordingly, as shown in FIG. 12D, the first display region 110A and the second display region 110B appear dark, while the color of the boundary region 111 appears to change greatly depending on the observation angle.

As described above, it is possible to form images which vary depending on the difference in observation position and represent images with more variety by combinations of the first display region 110A and the second display region 110B in which the multilayer film layer 16 is disposed on the surface having the protrusion-recess structure, and the boundary region 111 in which the multilayer film layer 16 is disposed on the flat surface. For example, the boundary region 111 appears as an iridescent border of characters or images represented by the first display region 110A or the second display region 110B. Accordingly, the designability of the display 101 is further improved.

In terms of obtaining such an effect, the shape of the boundary region 111 is not limited, and the boundary region 111 may have any size that is visually recognizable. Specifically, the minimum width of the boundary region 111 in the direction in which the first display region 110A and the second display region 110B are arranged may be larger than 50 μm. Further, the position of the boundary region 111 is not limited to a position between the first display region 110A and the second display region 110B. For example, the boundary region 111 may be located between a plurality of first display regions 110A as a border of the respective first display regions 110A.

<Configuration having Pixels with Different Color Hues>

The color hue exhibited by the first pixel 10A and the color hue exhibited by the second pixel 10B can be different from each other. In this case, when each of the first pixel 10A and the second pixel 10B are formed of the protrusion-recess structure 11 having the first structure, the first pixel 10A and the second pixel 10B are different from each other in the height h1 of the protrusion 15a. On the other hand, the configuration of the multilayer film layer 16 is common to the first pixel 10A and the second pixel 10B, that is, the material and film thickness of the high refractive index layer 16a, the material and film thickness of the low refractive index layer 16b, and the number of layers of these layers are the same. The height h1 of the protrusion 15a in each of the pixels 10A and 10B may be determined according to a desired color hue of each of the pixels 10A and 10B.

Here, the larger the difference between the height h1 of the protrusion 15a of the first pixel 10A and the height h1 of the protrusion 15a of the second pixel 10B, the larger the difference between the color hue exhibited by the first pixel 10A and the color hue exhibited by the second pixel 10B, and the difference in color hue can be easily recognized by the human eye. For example, the difference between the height h1 of the protrusion 15a of the first pixel 10A and the height h1 of the protrusion 15a of the second pixel 10B is preferably 5 nm or more, and is preferably 1% or more of the peak wavelength of the light reflected by the multilayer film layer 16 when the multilayer film layer 16 is disposed on a flat surface.

Specifically, when the peak wavelength of the light reflected by the multilayer film layer 16 which is disposed on a flat surface is 500 nm, the height h1 of the protrusion 15a is preferably of the order of 100 nm if the pixel 10 is intended to display a green color, and the height h1 of the protrusion 15a is preferably of the order of 200 nm if the pixel 10 is intended to display a red color.

Further, when the protrusion-recess structure applied to the pixel 10 is the protrusion-recess structure 12 having the second structure configured such that the second protrusion element 15Eb occupies a smaller area than the first protrusion element 15Ea in the pattern formed by the protrusions 15c, the effect of the height h2 of the second protrusion element 15Eb on the color hue exhibited by the pixel 10 is extremely small. Accordingly, in the pixel 10 having the second structure, the color hue exhibited by the pixel 10 can also be adjusted by adjusting the height h1 of the first protrusion element 15Ea, which corresponds to the protrusion 15a of the first structure.

According to such a configuration, the difference in contrast between the first display region 110A and the second display region 110B is significant, and different color hues are visually recognized in the first display region 110A and the second display region 110B. Accordingly, the display 100 can form clearer and more varied images.

[Method of Producing Display]

Materials for the respective layers constituting the pixel 10 included in the displays 100 and 101, and a method for producing the displays 100 and 101 will be described below.

The substrate 15 is made of a material having optical transparency to light in the visible range, that is, a material transparent to light in the visible range. For example, synthetic silica substrate or a film made of resin such as polyethylene terephthalate (PET) is used as the substrate 15. When the substrate 15 has a protrusion-recess structure, the protrusion-recess structure on the surface of the substrate 15 is formed, for example, by using known microprocessing techniques such as lithography and dry etching by irradiating light or a charged particle beam.

Further, when the pixel 10 includes the resin layer 17, and the resin layer 17 has a protrusion-recess structure, the protrusion-recess structure of the resin layer 17 is fabricated, for example, by nanoimprinting. For example, when the protrusion-recess structure of the resin layer 17 is fabricated by photo-nanoimprinting, a photocurable resin as a resin for constituting the resin layer 17 is applied to a protrusion-recess surface of a mold, which is an intaglio plate having inverted protrusions and recesses of the protrusions and recesses of an object to be formed. Methods for applying a photocurable resin are not specifically limited, and known application methods such as ink jetting, spraying, bar coating, roll coating, slit coating, gravure coating, and the like may be used.

Then, the substrate 15 is disposed on the surface of the application layer made of the photocurable resin, and the application layer and the mold, which are pressed against each other, are irradiated with light through the substrate 15 or the mold. Subsequently, the mold is removed from the cured photocurable resin and the substrate 15. Accordingly, the protrusions and recesses of the mold are transferred to the photocurable resin, and the resin layer 17 having a protrusion-recess surface is formed. The mold is made of, for example, synthetic silica or silicon, and is formed by using known microprocessing techniques such as lithography and dry etching by irradiating light or charged particle beam. Further, the photocurable resin may be irradiated with light while it is applied to the surface of the substrate 15 and the mold is pressed against the application layer of the substrate 15.

Further, instead of the photo-nanoimprinting, thermal nanoimprinting may also be used. In this case, a resin according to the fabrication method such as a thermoplastic resin, a heat-curable resin, or the like is used as a resin of the resin layer 17.

The substrate 15 is continuous with the first pixel 10A and the second pixel 10B, that is, these pixels 10A and 10B have one common substrate 15. Further, when the pixel 10 has the resin layer 17, the resin layer 17 is continuous with both the first pixel 10A and the second pixel 10B.

When the substrate 15 has a protrusion-recess structure, the protrusion-recess structure on the surface of the substrate 15 is formed, for example, by lithography or dry etching performed to each of a portion included in the first pixel 10A and a portion included in the second pixel 10B. When a portion corresponding to the first pixel 10A and a portion corresponding to the second pixel 10B have different directions in the pattern of the resist mask, the first pixel 10A and the second pixel 10B having different extending directions C2 can be formed. Further, in order to have different heights of the protrusion between the first pixel 10A and the second pixel 10B, an etching time can be modified.

Further, when the pixel 10 has the resin layer 17, and the resin layer 17 has a protrusion-recess structure, a mold in which the direction of the pattern of the protrusions and recesses is different between a portion corresponding to the first pixel 10A and a portion corresponding to the second pixel 10B is used with nanoimprinting. Accordingly, in the resin layer 17, the protrusion-recess structures in a portion included in the first pixel 10A and a portion included in the second pixel 10B are simultaneously formed. When the height of the protrusion is different between the first pixel 10A and the second pixel 10B, a mold in which the height of the protrusions and recesses is different between a portion corresponding to the pixel 10A and 10B is used so that the protrusion-recess structures of the resin layer 17 in the pixels 10A and 10B are simultaneously formed.

The mold in which the height of the protrusions and recesses is different between a portion corresponding to the first pixel 10A and a portion corresponding to the second pixel 10B may also be formed by lithography or dry etching performed to each portion corresponding to the pixels 10A and 10B. Further, a mold can be more easily formed, for example, by the following methods. That is, a resist pattern may be formed by modifying a dose of charged particle beam irradiated to a resist used in charged particle beam lithography for each of the portions corresponding to the pixels 10A and 10B to thereby adjust the development time so that protrusions and recesses of a desired height corresponding to each of the portions corresponding to the pixels 10A and 10B are formed. After a metal layer such as nickel is formed on the surface of the resist pattern by electrocasting, the resist is melted. Thus, a mold made of nickel is obtained.

The high refractive index layer 16a and the low refractive index layer 16b constituting the multilayer film layer 16 is made of a material having optical transparency to light in the visible range, that is, a material transparent to light in the visible range. In a configuration in which the refractive index of the high refractive index layer 16a is higher than the refractive index of the low refractive index layer 16b, materials for these layers are not limited. The larger the difference in refractive index between the high refractive index layer 16a and the low refractive index layer 16b, the smaller the number of laminated layers required to obtain high-intensity reflected light. From this point of view, for example, when the high refractive index layer 16a and the low refractive index layer 16b are made of an inorganic material, it is desirable that the high refractive index layer 16a is made of titanium dioxide ($TiO_2$) and the low refractive index layer 16b is made of silicon dioxide ($SiO_2$). The high refractive index layer 16a and the low refractive index layer 16b made of such inorganic materials are formed by a known thin film formation technique such as sputtering, vacuum vapor deposition, atomic layer deposition, or the like. Further, the high refractive index layer 16a and the low refractive index layer 16b may also be made of organic materials. In this case, the high refractive index layer 16a and the low refractive index layer 16b may be formed by a known technique such as self-organization.

The film thickness of the high refractive index layer 16a and the low refractive index layer 16b may be designed by using a transfer matrix method or the like depending on a desired color to be developed by the pixel 10. For example, in fabrication of a pixel 10 for exhibiting a blue color, the film thickness of the high refractive index layer 16a made of $TiO_2$ is preferably of the order of 40 nm, and the film thickness of the low refractive index layer 16b made of $SiO_2$ is preferably of the order of 75 nm.

Further, although FIGS. 2 and 4 illustrate the multilayer film layer 16 formed of ten layers in which the high refractive index layer 16a and the low refractive index layer 16b are alternately laminated as the multilayer film layer 16 in this order from a position adjacent to the substrate 15, the number of layers included in the multilayer film layer 16 and the order of lamination are not limited thereto. Other configurations are also possible as long as the high refractive index layer 16a and the low refractive index layer 16b are designed to obtain reflected light in a desired wavelength range. For example, the high refractive index layer 16a and the low refractive index layer 16b may be alternately laminated with the low refractive index layer 16b being in contact with the surface of the substrate 15. Further, a layer of the multilayer film layer 16 which forms the outermost layer on a side opposite to that contacting with the substrate 15 may be either the high refractive index layer 16a or the low refractive index layer 16b. Moreover, as long as the low refractive index layer 16b and the high refractive index layer 16a are alternately laminated, a layer in contact with the surface of the substrate 15 and a layer forming the outermost surface described above may be made of the same material. Further, the multilayer film layer 16 may also be formed of a combination of three or more layers having different refractive indexes.

In summary, the multilayer film layer 16 may be configured such that layers adjacent to each other have refractive indices that are different from each other, and the reflectivity to light of a specific wavelength range, in the incident light that is incident on the multilayer film layer 16, is higher than the reflectivity to other wavelength ranges.

The multilayer film layer 16 is continuous with the first pixel 10A and the second pixel 10B, and parts of the multilayer film layer 16 corresponding to the first pixel 10A and the second pixel 10B are simultaneously formed by the same step.

According to such a fabrication method, in the case where the first pixel 10A and the second pixel 10B exhibit different color hues, the multilayer film layer 16 for portions corresponding to each of the pixels 10A and 10B may be simultaneously formed as with the case where the first pixel 10A and the second pixel 10B exhibit the same color hue. Thus, the displays 100 and 101 can be formed by a simple production step.

Compared with the configuration of the present embodiment, it is also possible to form the first pixel 10A and the second pixel 10B exhibiting different color hues by using different materials, film thicknesses, and the like for the layers constituting the multilayer film layer 16 between the first pixel 10A and the second pixel 10B. However, if the configurations of the multilayer film layer 16 are different for each of the display regions 110, it is necessary to repeat masking for the regions and film formation for the high refractive index layer 16a and the low refractive index layer 16b. Accordingly, the production steps become complex. This results in an increase in the production cost and a decrease in the yield. Further, since masking for a fine region is difficult to perform, there is a limit for formation of a precise image.

On the other hand, according to the configuration of the displays 100 and 101 of the present embodiment, parts of the multilayer film layer 16 corresponding to the first display region 110A and the second display region 110B can be simultaneously formed. Accordingly, load for the production of the displays 100 and 101 is reduced. Further, compared with masking for fine regions, it is easy to change the height of the protrusion for each of the fine regions. Accordingly, the displays regions 110A and the 110B can be reduced in size to form a more precise image.

Moreover, in order to provide the first pixel 10A and the second pixel 10B with the multilayer film layer 16 having the same configuration and the protrusions having different heights to develop different color hues, the multilayer film layer 16 is preferably formed as described below. That is, the multilayer film layer 16 is preferably configured such that the peak wavelength of the light reflected by the multilayer film layer 16 when the multilayer film layer 16 is disposed on a flat surface is between the wavelength of light of the color hue developed by the first pixel 10A and the wavelength of light of the color hue developed by the second pixel 10B.

Varying the height of the protrusion causes a change in the shape of the layers constituting the multilayer film layer 16 to change the optical path length, and a change in the wavelength range of light which is efficiently scattered by the protrusion-recess structure. As a result of such a phenomenon, the color hue visually recognized by the pixel 10 is expected to change.

Further, when the boundary region in which protrusions and recesses are not formed on the protrusion-recess layer is located between the first display region 110A and the second display region 110B, a pattern of the resist mask used for formation of the protrusion-recess structure on the substrate 15 and a pattern of the protrusions and recesses of a mold used for formation of the protrusion-recess structure on the resin layer 17 can be adjusted to thereby form a region which does not have protrusions or recesses in the protrusion-recess layer. When the resin layer 17 having the protrusion-recess structure is formed by nanoimprinting, portions of the protrusion-recess layer for each of the first display region 110A, the second display region 110B, and the boundary region can be simultaneously formed. Further, portions of the multilayer film layer 16 corresponding to each of the first display region 110A, the second display region 110B, and the boundary region can also be simultaneously formed.

As described above, according to the above embodiment, the following effects can be achieved.

(1) In the pixel 10, reflected light of a specific wavelength range from the multilayer film layer 16 is scattered with anisotropy in the width direction C1 due to the protrusion-recess structure of the pixel 10. Further, since the extending direction C2 of the first pixel 10A and the extending direction C2 of the second pixel 10B are different from each other, the direction in which reflected light is scattered by the first pixel 10A and the direction in which reflected light is scattered by the second pixel 10B are different from each other. As a result, light reflected by the pixels 10 different from each other can be visually observed depending on the observation position, and, for example, different images depending on the observation position can be visually observed. Thus, the designability of the display 100 is improved.

In particular, since the extending direction C2 of the first pixel 10A and the extending direction C2 of the second pixel 10B are perpendicular to each other, difference in the image depending on the observer's position can be easily recognized. Further, arrangement and design of the pixels 10 in the displays 100 and 101 is easy.

(2) In the protrusion-recess structure in the protrusion-recess layer of the pixel 10, the rectangle R constituting the pattern of the protrusion has a length in the width direction C1 of 830 nm or less. Since the spectrum and interference attributed to the protrusion-recess structure can be reduced in the configuration in which the height of the protrusion is 415 nm or less, the visibility of the light reflected by the multilayer film layer 16 can be increased. Further, in a configuration in which an average length of the plurality of rectangles R in the extending direction C2 is 4.15 μm, and the standard deviation is 1 μm or less, the light reflected by the multilayer film layer 16 can be efficiently scattered. Further, in a configuration in which a ratio of an area occupied by the protrusions to the area constituting the pixel 10 is in the range of 40% or more and 60% or less when the protrusion-recess structure is viewed in a direction perpendicular to the surface of the protrusion-recess layer, large spread of light reflected by the multilayer film layer 16 can be ensured.

(3) Since the material and film thickness of the layers constituting the multilayer film layer 16 are the same in the first pixel 10A and the second pixel 10B, the multilayer film layer 16 for a region corresponding to the first pixel 10A and a region corresponding to the second pixel 10B can be simultaneously formed by the same step. Accordingly, the displays 100 and 101 can be formed by a simple production step.

Further, in a configuration in which the height of the protrusion in the protrusion-recess layer in the first pixel 10A and the height of the protrusion in the protrusion-recess layer in the second pixel 10B are different with a difference of 5 nm or more, the color hues visually recognized in the first display region 110A and the second display region 110B are different from each other. Thus, designability of the displays 100 and 101 is improved. Since such a difference in color hue is achieved by the difference in height of the protrusions, and the multilayer film layers 16 in the first pixel 10A and the second pixel 10B have the same configuration, there is no need of forming different multilayer film layer 16 for each of the display regions 110. Accordingly, displays 100 and 101 having pixels 10 that exhibit color hues different from each other can be formed by a simple production step.

(4) The boundary region in which the protrusion-recess layer has a flat surface is located between the first display region 110A and the second display region 110B, and the minimum width of the boundary region is one-half or more of the thickness of the multilayer film layer 16. In such a configuration, at the boundary between the first display region 110A and the second display region 110B, the protrusions of the multilayer film layer 16 of the first pixel 10A and the protrusions of the multilayer film layer 16 of the second pixel 10B are prevented from being continuous with each other, and thus the protrusion-recess structure on the surface of the multilayer film layer 16 of the pixel 10 is prevented from being modified. As a result, desired color development can be readily obtained from the entire pixel 10 in desired directions.

(5) In a configuration in which the maximum width of the boundary region is 50 μm or less, the boundary region has a size that is not visually recognizable. With this configuration, light reflected by the boundary region is prevented from being visually recognized by the observer. Accordingly, the first display region 110A and the second display region 110B appear to the observer as if they are in contact with each other. Since desired color development can be readily obtained from the entire pixel 10 in desired directions in each of the first display region 110A and the second display region 110B, it is possible to form a precise image by the first display region 110A and the second display region 110B.

(6) In a configuration in which the maximum width of the above boundary region is 50 μm or more, the boundary region 111 has a size that is visually recognizable. With this configuration, light reflected by the boundary region 111, that is, reflected light emitted in the specular reflection direction without having anisotropy is visually recognized by the observer according to the observation angle. Accordingly, it is possible to form an image that changes greatly depending on the difference in the observation position by combination of the first display region 110A and the second display region 110B that cause reflected light of a specific wavelength range to be observed in a wide angular range at a specific observation position, and the boundary region that causes reflected light of a specific wavelength range corresponding to the observation angle to be observed at any observation position. Therefore, it is possible to represent images with more variety, and thus further improve the designability of the display 101.

(7) In a configuration in which the pixel 10 has a protrusion-recess structure of the first structure, the diffusion effect of the reflected light is obtained by the protrusions, and in each of the pixels 10, light of a specific wavelength range is visually recognized in a wide angular range as light reflected by the multilayer film layer 16. Further, compared with the case where the pixel 10 has a protrusion-recess structure of the second structure, it is possible to reduce the load required for design and production of the protrusion-recess structure in the protrusion-recess layer.

(8) In a configuration in which the pixel 10 has a protrusion-recess structure of the second structure, diffusion effect and diffraction effect of light are obtained by the protrusions, and in each of the pixels 10, light of a specific wavelength range is visually recognized in a wide angular range as light reflected by the multilayer film layer 16. Further, since the intensity of the reflected light is increased, bright and vivid colors are visually recognized.

(9) According to the method for producing the protrusion-recess structure of the protrusion-recess layer by nanoimprinting, a fine protrusion-recess structure can be produced in a suitable and simple manner. Further, since the protrusion-recess structure of a portion included in the first pixel 10A and a portion included in the second pixel 10B in the protrusion-recess layer is simultaneously formed, it is possible to reduce the load required for production of the protrusion-recess layer compared with the case where the protrusion-recess structure is formed for each of the pixels 10.

For a production method which uses photo-nanoimprinting or thermal nanoimprinting as the nanoimprinting, it is possible to form the protrusion-recess structure by nanoimprinting in a suitable and simple manner.

[Modifications]

The above embodiment can be implemented with modifications as described below.

The extending direction C2 of the first pixel 10A and the extending direction C2 of the second pixel 10B may be different from each other, and may not necessarily be perpendicular to each other. In other words, the displays 100 and 101 may include a plurality of pixels 10 having extending directions C2 in the protrusion-recess structure different from each other. For example, in a region formed of a group of the plurality of pixels 10 having various extending directions C2, light reflected by any of the pixels 10 is observed regardless of the observation position. Accordingly, for example, the above region appears bright regardless of the observation position when the pixel 10 has a size that is not recognizable by the resolution of the human eye. Further, when the plurality of pixels 10 are configured to exhibit different color hues for each of the pixels 10 having the same extending direction C2, the above region appears as different color hues depending on the observation position.

As described above, by adjusting the extending direction C2, colors, and arrangement of the plurality of pixels 10, the displays 100 and 101 can exhibit different brightness and color hues depending on the observation position, which is difficult for a configuration in which the multilayer film layer 16 is disposed on a flat surface. Thus, designability of the displays 100 and 101 is improved.

The protrusion-recess structure constituting the pixel 10 may include a protective layer that covers the surface of the multilayer film layer 16. With this configuration, since the protrusion-recess structure on the surface of the multilayer film layer 16 is protected, the protrusion-recess structure is prevented from being deformed by physical or chemical damage. Accordingly, since a change in optical path length of light reflected by the multilayer film layer 16 and a decrease in diffusion effect and diffraction effect of light reflected by the protrusion-recess structure are prevented, a desired color development by the pixel 10 can be suitably achieved.

Further, such a protective layer is preferably a black layer containing a black pigment or the like and is absorbent to light transmitted through the multilayer film layer 16. In this case, a side of the substrate 15 facing the multilayer film layer 16 corresponds to the front surface 100F of the displays 100 and 101 on a side opposite to the rear surface 100R, and the pixel 10 is observed via the substrate 15.

Since the multilayer film layer 16 and the protrusion-recess layer are made of a material transparent to light in the visible range, among the wavelength range included in the incident light, part of the light in the wavelength range other than the specific wavelength range reflected by the multilayer film layer 16 is transmitted through the multilayer film layer 16 and the protrusion-recess layer. As a result, when the pixel 10 formed of the multilayer film layer 16 and the protrusion-recess layer is observed from one side of the front and rear surfaces and when a light source or a structure such as a white board that reflects the transmitted light exists on the other side of the pixel 10, reflected light of a specific wavelength range from the multilayer film layer 16 is visually recognized on one side in addition to the light that has transmitted through the multilayer film layer 16 from the other side. As described above, the wavelength range of the transmitted light is different from the wavelength range of the reflected light, and color of the transmitted light is typically a complementary color of the reflected light. As a result, when such transmitted light is visually recognized, the visibility of the color of the reflected light is reduced.

On the other hand, when the protective layer is configured to absorb transmitted light that has been transmitted through the multilayer film layer 16, the light transmitted through the multilayer film layer 16 via the substrate 15 is absorbed by the protective layer, and the transmitted light is prevented from being reflected toward the substrate 15. Accordingly, light in a wavelength range different from that of the light reflected by the multilayer film layer 16 is prevented from being visually recognized. Accordingly, the visibility of color is prevented from being reduced by the reflected light, and desired color development by the pixel 10 can be suitably achieved.

Further, in such a configuration, on a surface of the substrate 15 on a side opposite to that facing the multilayer film layer 16, a reflection prevention layer having a function of reducing the surface reflection of this surface may also be provided. When the displays 100 and 101 are observed via the substrate 15, the visibility of color of the reflected light of a specific wavelength range reflected by the multilayer film layer 16 is reduced if the surface reflection of the substrate 15 is large. On the other hand, since surface reflection of the substrate 15 is reduced by providing a reflection prevention layer, the visibility of color is prevented from being reduced by light reflected by the multilayer film layer 16, and a desired color development by the displays 100 and 101 can be suitably achieved.

The protrusion in the protrusion-recess structure of the protrusion-recess layer may have a configuration in which the length in the width direction C1 gradually decreases from the proximal end toward the distal end. With this configuration, the multilayer film layer 16 can be easily formed on the protrusion. In this case, the length d1 and the length d3 in the width direction C1 are defined by the pattern formed by the bottom of the protrusion.

The number of the display regions included in the display 100 is not specifically limited, and the number of the display regions may be one, or three or more. Further, the display region may include any display element formed of the protrusion-recess structure, and the display element is not limited to an element that is a minimum repetition unit for forming a raster image, but may be a region formed by connecting anchor points for forming a vector image.

[Reference Signs List] C1: width direction; C2: extending direction; Dx: first direction; Dy: second direction; 10, 10A, 10B: pixel; 11, 12, 13: protrusion-recess structure; 15: substrate; 15a, 15c: protrusion; 15b: recess; 15Ea: first protrusion element; 15Eb: second protrusion element; 16: multilayer film; 16a: high refractive index layer; 16b: low refractive index layer; 17: resin layer; 100, 101: display; 100F: front surface; 100R: rear surface; 110, 110A, 110B: display region; 111: boundary region.

What is claimed is:

1. A display, comprising:
a plurality of display elements,
the display having a front surface and a rear surface, and each display element of said plurality comprising:
a protrusion-recess layer having a surface provided with a protrusion-recess structure; and
a multilayer film layer disposed on the protrusion-recess structure and having a surface shape which follows the protrusion-recess structure, wherein
the multilayer film layer is configured such that adjacent layers in a plurality of layers included in the multilayer film layer have refractive indices that are different from each other, and light of a specific wavelength range in incident light that is incident on the multilayer film layer has reflectivity higher than reflectivity of light of other wavelength ranges,
the protrusion-recess layer and the multilayer film layer are laminated in a thickness direction perpendicular to the front surface of the display,
a protrusion included in the protrusion-recess structure has a shape having at least one step on a surface of the protrusion-recess layer,
a pattern formed by the protrusion includes a pattern composed of a group of a plurality of rectangular shape elements when the protrusion-recess structure is viewed in a direction perpendicular to the surface of the protrusion-recess layer,
each of the rectangular shape elements of said plurality of rectangular shape elements has a length dimension which is larger than a width dimension, which is perpendicular to the width dimension, the width dimension being equal to or less than a wavelength in the specific wavelength range of the incident light,
among individual rectangular shape elements of said plurality of rectangular shape elements, a standard deviation of the length dimension is larger than a standard deviation of the width dimension, and
the plurality of display elements includes a first display element and a second display element, so that the plurality of rectangular shape elements includes a first subplurality of rectangular shape elements corresponding to the first display element and a second subplurality of rectangular shape elements corresponding to the second display element, a length dimension of each rectangular shape elements of the first subplurality of rectangular shape elements is parallel to a first direction and a length dimension of each rectangular shape elements of the second subplurality of rectangular shape elements is parallel to a second direction, which is different from the first direction.

2. The display of claim 1, wherein the first direction and the second direction are orthogonal to each other.

3. The display of claim 1, wherein, in each of the plurality of display elements, the width dimension of each rectangular shape element of said plurality of rectangular shape elements is 830 nm or less, and a height dimension of the protrusion forming the pattern composed of the group of the plurality of rectangular shape elements is 415 nm or less.

4. The display of claim 1, wherein, in each of the plurality of display elements, an average length dimension of a rectangular shape element of the plurality of rectangular shape elements is 4.15 µm or less, and a standard deviation of the length dimension among individual rectangular shape elements of said plurality of shape elements, is 1 µm or less.

5. The display of claim 1, wherein, in each display element of the plurality of display elements, a ratio of an area occupied by the protrusion forming the pattern composed of the group of the plurality of rectangular shape elements to an area constituting the display element is in a range of 40% or more and 60% or less when the protrusion-recess structure is viewed in a direction perpendicular to the surface of the protrusion-recess layer.

6. The display of claim 1, wherein a material and a film thickness of respective layers included in the multilayer film layer in the first display element and the second display element are the same.

7. The display of claim 6, wherein a height of the protrusion forming the pattern composed of the second subplurality of rectangular shape elements in the first display element and a height of the protrusion forming the pattern composed of the second subplurality of rectangular shape elements in the second display element are different from each other with a difference therebetween of 5 nm or more.

8. The display of claim 1, wherein
the display includes a first display region which includes the first display element, a second display region which includes the second display element, and a boundary region which is a region between the first display region and the second display region when viewed in a direction perpendicular to the front surface of the display,
the protrusion-recess layer is continuous with the first display region, the boundary region, and the second display region,
the multilayer film layer is continuous with the first display region, the boundary region, and the second display region,
a minimum width dimension of the boundary region in a direction in which the first display region and the second display region are arranged is one-half or more of a thickness of the multilayer film layer, and
a surface of the protrusion-recess layer in the boundary region is a flat surface.

9. The display of claim 8, wherein a maximum width dimension of the boundary region in a direction between the first display region and the second display region is 50 µm or less.

10. The display of claim 8, wherein a minimum width dimension of the boundary region in a direction between the first display region and the second display region is larger than 50 µm.

11. The display of claim 1, wherein,
in each display element of the plurality of display elements,
a pattern formed by the protrusion included in the protrusion-recess structure includes only a pattern composed of a group of the plurality of rectangular shape elements when the protrusion-recess structure is viewed in a direction perpendicular to the surface of the protrusion-recess layer, and
a height dimension of the protrusion included in the protrusion-recess structure is constant within the display element.

12. A method for producing a display including a plurality of display elements having a first display element and a second display element, the method comprising:
a first step of transferring a protrusion and a recess of an intaglio plate to a resin by using a nanoimprinting technique to form a protrusion-recess layer having a protrusion-recess structure on a surface, in which the protrusion-recess structure of a portion included in the first display element and a portion included in the second display element in the protrusion-recess layer are simultaneously formed, and
a second step of forming a multilayer film layer on the protrusion-recess structure such that adjacent layers in a plurality of layers included in the multilayer film layer have refractive indices that are different from each other, and light of a specific wavelength range in incident light that is incident on the multilayer film layer has reflectivity higher than reflectivity of light of other wavelength ranges, wherein,
in the first step, in a portion of the protrusion-recess layer included in each of the display elements,
a protrusion included in the protrusion-recess structure has a shape having at least one step on a surface of the protrusion-recess layer,
the protrusion-recess structure is formed such that, when the protrusion-recess structure is viewed in a direction perpendicular to the surface of the protrusion-recess layer, a pattern formed by the protrusion includes a pattern composed of a group of a plurality of rectangular shape elements,
each of the rectangular shape elements has a length dimension which is larger than a width dimension, which is perpendicular to the length dimension, the width dimension being equal to or less than a wavelength in the specific wavelength range of the incident light, and
among individual rectangular shape elements of said plurality of rectangular shape elements, a standard deviation of the length dimension is larger than a standard deviation of the width dimension, and
the protrusion-recess structure is formed such that the plurality of rectangular shape elements includes a first subplurality of rectangular shape elements corresponding to the first display element and a second subplurality of rectangular shape elements corresponding to the second display element, a length dimension of each rectangular shape elements of the first subplurality of rectangular shape elements is parallel to a first direction and a length dimension of each rectangular shape elements of the second subplurality of rectangular shape elements is parallel to a second direction, which is different from the first direction.

13. The method of producing a display of claim 12, wherein the nanoimprinting is photo-nanoimprinting or thermal nanoimprinting.

* * * * *